United States Patent
Nakagawa et al.

(10) Patent No.: US 6,316,931 B1
(45) Date of Patent: Nov. 13, 2001

(54) MAGNETIC SENSOR APPARATUS AND CURRENT SENSOR APPARATUS

(75) Inventors: Shiro Nakagawa; Kazuyuki Itoh; Yoshihisa Okita; Katsumi Yabusaki, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/484,796

(22) Filed: Jan. 18, 2000

Related U.S. Application Data

(63) Continuation of application No. PCT/JP99/03585, filed on Jul. 2, 1999.

(30) Foreign Application Priority Data

| Dec. 15, 1998 | (JP) | 10-356040 |
| Dec. 15, 1998 | (JP) | 10-356041 |
| Apr. 19, 1999 | (JP) | 11-110263 |

(51) Int. Cl.$^7$ .................................................. G01R 33/00
(52) U.S. Cl. ........................................................ 324/117 R
(58) Field of Search .............................. 324/117 R, 244, 324/251, 207.16, 654, 655, 127, 126, 225, 241, 253, 258; 323/251, 261, 262; 307/416, 417, 418

(56) References Cited

U.S. PATENT DOCUMENTS

| 4,384,254 | 5/1983 | Brown . |
| 4,503,395 | 3/1985 | Kratzer et al. . |
| 4,626,782 | * 12/1986 | Lewis .................................. 324/253 |
| 4,914,381 | * 4/1990 | Narod .................................. 324/117 R |
| 5,223,789 | 6/1993 | Katsuyama et al. . |
| 5,287,059 | 2/1994 | Ando et al. . |
| 5,537,038 | 7/1996 | Ando . |
| 6,183,889 | * 2/2001 | Koshiba et al. .................... 428/692 |

FOREIGN PATENT DOCUMENTS

| 0 155 324 B1 | 9/1985 | (EP) . |
| 60-57277 | 4/1985 | (JP) . |
| 60-185179 | 9/1985 | (JP) . |
| 62-55111 | 11/1987 | (JP) . |
| 63-52712 | 10/1988 | (JP) . |
| 2-287266 | 11/1990 | (JP) . |
| 3-135780 | 6/1991 | (JP) . |
| 3-191870 | 8/1991 | (JP) . |
| 4-24574 | 1/1992 | (JP) . |
| 6-94817 | 4/1994 | (JP) . |
| 7-23751 | 5/1995 | (JP) . |
| 9-61506 | 3/1997 | (JP) . |
| 9-257835 | 10/1997 | (JP) . |

OTHER PUBLICATIONS

T. Ohmori, *Sensor Technology*, p. 135.

* cited by examiner

*Primary Examiner*—Safet Metjahic
*Assistant Examiner*—E P LeRoux
(74) *Attorney, Agent, or Firm*—Oliff & Berridge, PLC

(57) ABSTRACT

It is an object of the invention to provide a magnetic sensor and a current sensor that exhibit high performance at low costs. A magnetic sensor has a magnetic core (1) having a magnetic saturation property and a sensor coil (2) wound around the magnetic core (1). An end of a detection coil (20) is connected to an end of the sensor coil (2). The other end of the detection coil (20) is grounded. The magnetic sensor further comprises a drive circuit (3) and a detection circuit (4). The drive circuit (3) has a series resonance circuit part of which is made up of the sensor coil (2). To the sensor coil (2) the drive circuit (3) supplies a resonance current flowing into the series resonance circuit as an alternating current that allows the magnetic core (1) to reach a saturation region. The detection circuit (4) detects a magnetic field to be measured by detecting variations in resonance current flowing through the sensor coil (2).

67 Claims, 21 Drawing Sheets

MAGNETIC SENSOR APPARATUS AND CURRENT SENSOR APPARATUS

This is a continuation of application No. PCT/JP99/03585 filed Jul. 2, 1999. The entire disclosure of the prior application(s) is hereby incorporated by reference herein in its entirety.

TECHNICAL FIELD

The present invention relates to a magnetic sensor apparatus for measuring a relatively large magnetic field and an electric current sensor apparatus used for non-contact measurement of a large current through the use of the magnetic sensor apparatus.

BACKGROUND ART

Many types of magnetic sensor apparatuses and non-contact-type electric current sensor apparatuses utilizing magnetic sensor apparatuses have been long developed since such apparatuses are useful in industry. However, their application fields have been limited and the market scale have been thus limited. Consequently, development of such apparatuses in terms of cost reduction have not been fully achieved yet.

However, emission control originating from the need for solving environmental problems has accelerated development of electric automobiles and solar-electric power generation. Since a direct current of several kilowatts to tens of kilowatts is dealt with in an electric car or solar-electric power generation, a non-contact current sensor apparatus is required for measuring a direct current of tens to hundreds of amperes. The demand for such current sensor apparatuses is extremely high. It is therefore difficult to increase the popularity of electric automobiles and solar-electric power generation unless the current sensor apparatuses not only exhibit excellent properties but also are extremely low-priced. In addition, reliability is required for a period of time as long as 10 years or more for a current sensor apparatus used in a harsh environment as in an electric car. As thus described, it has been requested in society to provide current sensor apparatuses that are inexpensive and have excellent properties and long-term reliability.

For non-contact measurement of an electric current, an alternating current component is easily measured through the use of the principle of a transformer. However, it is impossible to measure a direct current component through this method. Therefore, a method is taken to measure a magnetic field generated by a current through a magnetic sensor for measuring a direct current component. A Hall element is widely used for such a magnetic sensor. A magnetoresistive element and a fluxgate element are used in some applications, too.

For example, the following problems have been found in the current sensor apparatus utilizing a Hall element that has been most highly developed in prior art.

(1) low sensitivity
(2) inconsistent sensitivity
(3) poor thermal characteristic
(4) offset voltage that requires troublesome handling In addition to the above problems, a magnetoresistive element has a problem of poor linearity.

Some methods have been developed for solving the problems of a Hall element. One of the methods is a so-called negative feedback method, that is, to apply a reversed magnetic field proportional to an output of the element to the element so as to apply negative feedback such that the output of the element is maintained constant. Consistency in sensitivity, the thermal characteristic, and linearity are thereby improved.

When the negative feedback method is used, however, it is required to apply an inverse magnetic field as large as the field to be measured to the element. Consequently, when a current as high as hundreds of amperes is measured in applications such as an electric car or solar-electric power generation, a feedback current obtained is several amperes even if the number of turns of the coil for generating a feedback field is 100. Therefore, a current sensor apparatus embodied through this method is very large-sized and expensive.

If the magnetic sensor element has high sensitivity, it is possible that a feedback current is reduced by applying only part (such as one hundredth) of the field to be measured to the element. However, this is difficult for a Hall element with low sensitivity used as the magnetic sensor element.

As thus described, it is difficult in prior art to apply the negative feedback method to a current sensor apparatus used for non-contact measurement of a large current containing a direct current component. It is therefore difficult to implement an inexpensive current sensor apparatus having excellent characteristics.

A fluxgate element has been developed mainly for measurement of a small magnetic field while not many developments have been made in techniques for measuring a large current. However, with some modification a fluxgate element may be used as a magnetic detection unit of a current sensor apparatus for a large current since the fluxgate element has a simple configuration and high sensitivity.

Reference is now made to FIG. 25 to describe the operation principle of a fluxgate element having the simplest configuration. FIG. 25 is a plot for showing the relationship between an inductance of a coil wound around a magnetic core and a coil current. Since the core has a magnetic saturation property, the effective permeability of the core is reduced and the inductance of the coil is reduced if the coil current increases. Therefore, if bias magnetic field B is applied to the core by a magnet and the like, the magnitude of external magnetic field $H_o$ is measured as a change in inductance of the coil when external field $H_o$ is superposed on the bias field. This is the operation principle of the simplest fluxgate element. In FIG. 25 each of bias field B and external field $H_o$ is expressed in the magnitude converted to the coil current.

In this method the position of bias point B changes with factors such as the intensity of the magnetic field generated by the magnet or the positions of the magnet and the core in relation to each other. It is therefore required to maintain the inductance at a specific value when the external magnetic field is zero. However, it is extremely difficult to compensate the instability of the inductance value due to temperature changes and other external perturbations. This method is therefore not suitable for practical applications.

If a rod-shaped magnetic core is used, an open magnetic circuit is provided, so that the effect of hysteresis is generally very small. Assuming that the hysteresis of the core is negligible, the characteristic of variations in inductance is equal when the coil current flows in the positive direction and in the negative direction since the saturation characteristic of the core is independent of the direction of coil current. For example, in FIG. 25 it is assumed that point $P_+$ and point $P_-$ represent the coil current in the positive direction and the coil current of the negative direction, respectively, whose absolute values are equal to each other. In the neighborhood of these points, the characteristic of variations in inductance with respect to variations in the absolute value of the coil current is equal. Therefore, an alternating current may be applied to the coil such that the core is driven into a saturation region at a peak, and the difference in the amount of decrease in inductance may be measured when positive and negative peak values of the current are obtained. As a result, the difference thus measured is constantly zero when the external magnetic field is zero, which is always the case even when the characteristics of the core change due to temperature changes or external perturbations. In the present patent application a saturation region of the magnetic core means a region where an absolute value of the magnetic field is greater than the absolute value of the magnetic field when the permeability of the core is maximum.

An external magnetic field is assumed to be applied to the core. If external field $H_o$ is applied in the positive direction of the current, as shown in FIG. 25, the inductance value decreases at the positive peak of the current (point $Q_+$ in FIG. 25, for example) and the inductance value increases at the negative peak of the current (point $Q_-$ in FIG. 25, for example). Therefore, the difference between the values is other than zero. Since the difference in inductance depends on the external magnetic field, the external field is obtained by measuring the difference in inductance.

The method thus described is called a large amplitude excitation method in the present patent application, that is, to apply an alternating current to the coil such that the core is driven into a saturation region at a peak, and to measure the difference in the amounts of decrease in inductance when positive and negative peak values of the current are obtained.

Magnetic sensor apparatuses that utilize such a large amplitude excitation method are disclosed in Published Examined Japanese Patent Application Sho 62-55111 (1987), Published Examined Japanese Patent Application Sho 63-52712 (1988), and Published Unexamined Japanese Patent Application Hei 9-61506 (1997), for example. In Published Examined Japanese Utility Model Application Hei 7-23751 (1995), a technique is disclosed to achieve measurement similar to the large amplitude excitation method through the use of two bias magnets.

The large amplitude excitation method is an excellent method since the effects of temperature changes and external perturbations are eliminated. However, because of the following problems, for example, it is not so easy to apply an alternating current enough to drive the core into saturation.

First, if the number of turns of the coil is increased, magnetomotive force obtained with the same current value increases, but the inductance of the coil increases. Consequently, it is required to reduce the frequency of the alternating current supplied to the coil or to increase the voltage. However, an increase in voltage is limited by the supply voltage of the apparatus. A reduction in frequency results in a reduction in response frequency limit of the sensor. Therefore, an increase in voltage or a reduction in frequency is not always acceptable.

Next, if the magnetic core is made extremely thin to facilitate saturation, a portion of the coil inductance owing to the core is reduced and a variation in inductance is reduced. That is, the sensitivity of the magnetic sensor apparatus is reduced.

Next, in order to improve the magnetic properties and obtain a sharp saturation characteristic, a specific magnetic core, that is, an expensive core that is not mass-produced is required, and the price of the apparatus is thereby raised. Furthermore, it is not certain whether a magnetic core newly developed for a magnetic sensor apparatus would maintain reliability for a period of time as long as ten years or more in a harsh environment as in an electric car.

As described so far, it is difficult in prior art to provide a magnetic sensor apparatus to satisfy the demands in society as described above.

In pages 135 to 137 of Toyoaki Omori ed. 'Fukyu-ban Sensor Gijutsu (Popular Edition of Sensor Technology)', Fuji Technosystem, published on Jul. 18, 1998, a technique is disclosed to form a resonant circuit made up of a sensor coil for measuring an external magnetic field and a capacitor and to generate an alternating current used for the large amplitude excitation method by an oscillation circuit incorporating the resonant circuit.

In this technique, however, two coils are wound around the single core, that is, an excitation coil for passing an alternating current for the large amplitude excitation method, and the sensor coil. As a result, manufacturing costs are raised.

Examples in which excitation is achieved through the use of a self-excited resonant circuit in a magnetic sensor apparatus using the large amplitude excitation method are disclosed in Published Unexamined Japanese Patent Application Sho 60-57277 (1985), Published Unexamined Japanese Patent Application Hei 4-24574 (1992), Published Unexamined Japanese Patent Application Hei 6-94817 (1994), U.S. Pat. No. 4,384,254, and U.S. Pat. No. 4,626, 782.

Examples of output detection methods in a magnetic sensor apparatus using a fluxgate element are disclosed in Published Unexamined Japanese Patent Application Hei 2-287266 (1990), Published Unexamined Japanese Patent Application Hei 3-135780 (1991), Published Unexamined Japanese Patent Application Hei 3-191870 (1991), and U.S. Pat. No. 4,503,395.

In a magnetic sensor apparatus using a fluxgate element, some means are required for detecting a variation in inductance of the sensor coil to detect a magnetic field to be measured when an alternating current used for the large amplitude excitation method is supplied to the sensor coil through the use of a resonant circuit incorporating the sensor coil. That is, to detect a variation in inductance of the sensor coil, a variation in voltage across the sensor coil may be detected, or a variation in resonant frequency may be detected. However, the former method has a problem that it is difficult to detect a variation in voltage in a resonant state. The latter method has a problem that, since the resonant frequency is proportional to the square root of the inductance, the sensitivity is low and not practical.

In the magnetic sensor apparatus using the fluxgate element, when an alternating current used for the large amplitude excitation method is supplied to the sensor coil through the use of the resonant circuit as described above, to further adopt the negative feedback method, it is required to supply a negative feedback current so that resonance will not stop. Therefore, some means are further required.

In Published Unexamined Japanese Patent Application Sho 60-185179 (1985) and Published Unexamined Japanese Patent Application Hei 9-257835 (1997), examples in which the negative feedback method is adopted to a magnetic sensor apparatus using a fluxgate element are disclosed. In these examples, however, a case in which an alternating current used for the large amplitude excitation method is supplied to a sensor coil through the use of a resonant circuit is not considered.

As described above, the large amplitude excitation method is an excellent method since the effects of temperature changes and external perturbations are eliminated. However, even though this method is adopted, the following problems are still found in an actual magnetic sensor apparatus or current sensor apparatus.

In the large amplitude excitation method, according to the principle, when the external magnetic field is zero, the difference in amounts of decrease in inductance of the sensor coil (hereinafter called an amount of the inductance variation) at positive and negative peak values of excitation current is constantly zero, which is supposed to be unchanged even if the characteristics of the sensor core change due to a change in temperature or external perturbations. In fact, however, the positive and negative peak values of excitation current are not completely symmetric due to distortion of the waveform of the excitation current. As a result, even when the external magnetic field is zero, there is a slight difference in inductance values at positive and negative peaks of the excitation current. This difference changes in direct proportion to the magnitudes of variations in inductance at positive and negative peaks of excitation current. Therefore, a measurement error (hereinafter called an offset error) of the sensor apparatus resulting from distortion of the excitation current waveform when the external field is zero is affected by external perturbations that cause variations in inductance of the sensor coil at positive and negative peaks of excitation current.

A case in which the negative feedback method is applied to a sensor apparatus is considered. The sensor apparatus may cause an offset error that is affected by external perturbations. In the negative feedback method, according to the principle, a canceling magnetic field is applied to the sensor core so that the external field applied to the core is cancelled, and the field inside the core is controlled to be constantly zero. The fact that the field inside the core is zero is detected when the difference in the amounts of inductance variations at positive and negative peaks of excitation current is zero. Since the unknown external field is equal to the known canceling field, the external field is obtained from the canceling field.

Assuming that there is an offset error that is affected by external perturbations, the difference in the amounts of inductance variation at positive and negative peaks of excitation current is zero, due to the above-mentioned canceling field. However, the magnetic field inside the sensor core is not zero, but an inverse direction field is applied to the core because of the canceling field. The inverse direction field causes a difference in amounts of inductance variations that corresponds to a measurement signal whose absolute value is equal to the offset error.

Accordingly, the fact that the offset error changes in response to external perturbations is equal to the fact that the field (that corresponds to the measurement signal of the sensor apparatus) applied for canceling the external field is affected by external perturbations. Therefore, when there is asymmetry between positive and negative peak values of excitation current, due to distortion of the excitation current waveform, the measurement signal of the fluxgate magnetic sensor apparatus or current sensor apparatus implemented through the combination of the large amplitude excitation method and the negative feedback method is affected by external perturbations that may cause variations in inductance of the sensor coil at positive and negative peaks of excitation current.

Such external perturbations include:
(1) those resulting from changes in supply voltage of the excitation drive circuit of the sensor coil
   (1-1) changes in excitation current amplitude due to changes in supply voltage
   (1-2) changes in distortion of excitation current waveform due to changes in supply voltage
(2) those resulting from changes in temperature
   (2-1) changes in magnetic properties of the core due to temperature changes
   (2-2) sensor coil deformation due to heat
   (2-3) changes in stress of the core due to thermal expansion and so on
   (2-4) sensor coil heated due to excitation current or feedback current
   (2-5) changes in excitation amplitude due to thermal characteristics of the excitation circuit or those of active elements, in particular.

It is extremely difficult to compensate for a number of factors causing inductance variations that result from various sources individually. In prior art, for example, a constant voltage source has been used for the supply source of the sensor apparatus to reduce supply voltage variations, and a temperature sensing element such as a thermistor has been used to compensate for thermal characteristics. However, adopting a constant voltage source causes not only an increase in cost but also an increase in power consumption. If a thermistor is used to compensate for thermal characteristics, it is difficult to determine compensation characteristics, and moreover, compensation is not fully achieved in many cases.

As described so far, it may be possible to implement a magnetic sensor apparatus or current sensor apparatus having excellent stability against external perturbations through adopting the large amplitude excitation method or the negative feedback method to a fluxgate magnetic or current sensor apparatus. However, the feature of those methods, that is, 'excellent stability against external perturbations' has not been fully appreciated in prior-art fluxgate magnetic or current sensor apparatuses since variations in inductance of the sensor coil at positive and negative peaks of excitation current are caused by external perturbations and a measurement error may be varied.

DISCLOSURE OF THE INVENTION

It is a first object of the invention to provide a magnetic sensor apparatus and a current sensor apparatus that are inexpensive and have excellent characteristics.

In addition to the above-stated first object, it is a second object of the invention to provide a magnetic sensor apparatus and a current sensor apparatus that exhibit high reliability for a long term.

It is a third object of the invention to provide a magnetic sensor apparatus and a current sensor apparatus that are stable against external perturbations.

A first magnetic sensor apparatus or a first current sensor apparatus of the invention comprises: a magnetic core; a sensor coil wound around the core and provided for detecting an applied magnetic field to be measured; a drive means having a series resonant circuit part of which is made up of the sensor coil, the drive means driving the sensor coil by supplying a resonant current flowing through the series resonant circuit to the sensor coil; and an inductance element connected to the sensor coil in series.

According to the first magnetic sensor apparatus or current sensor apparatus of the invention, the drive means supplies a resonant current flowing through the series resonant circuit part of which is made up of the sensor coil to the sensor coil. The inductance element connected to the sensor coil in series is used for detecting a variation in the resonant current flowing through the sensor coil, or for supplying the second current to the sensor coil, for example. The second current includes a direct current, that is, a current having no frequency and has a frequency different from the resonant frequency of the series resonant circuit. In the present invention the magnetic core is a core made of a magnetic substance having a magnetic saturation property on which the coil is wound. To drive the sensor coil means to supply an alternating current to the sensor coil.

A second magnetic sensor apparatus or a second current sensor apparatus of the invention comprises: a magnetic core; a sensor coil wound around the core and provided for detecting an applied magnetic field to be measured; a drive means having a series resonant circuit part of which is made up of the sensor coil, the drive means driving the sensor coil by supplying a resonant current flowing through the series resonant circuit to the sensor coil; and a detection means for detecting the magnetic field by detecting a variation in the resonant current flowing through the sensor coil.

According to the second magnetic sensor apparatus or current sensor apparatus of the invention, the drive means supplies a resonant current flowing through the series resonant circuit part of which is made up of the sensor coil to the sensor coil. The detection means detects a variation in the resonant current flowing through the sensor coil. The magnetic field to be measured is thereby detected.

According to the second magnetic sensor apparatus or current sensor apparatus, the resonant current may be a current having such a magnitude that the core is driven into a saturation region.

According to the second magnetic sensor apparatus or current sensor apparatus, the detection means may have: an inductance element inserted to the series resonant circuit; and a differentiation circuit for differentiating a voltage generated across the inductance element and outputting a signal corresponding to the magnetic field to be measured.

According to the second magnetic sensor apparatus or current sensor apparatus, the drive means may have an alternating current source for supplying an alternating current to the series resonant circuit, the alternating current being tuned with a resonant frequency of the series resonant circuit.

According to the second magnetic sensor apparatus or current sensor apparatus, the drive means may have an oscillation circuit including the series resonant circuit. In this case, the oscillation circuit may be a Clapp oscillation circuit or a Colpitts oscillation circuit.

According to the second magnetic sensor apparatus or current sensor apparatus, the magnetic core may be made of ferrite.

A third magnetic sensor apparatus or a third current sensor apparatus of the invention comprises: a magnetic core; a sensor coil wound around the core and provided for detecting an applied magnetic field to be measured; a drive means for driving the sensor coil by supplying an alternating current thereto; an inductance element connected to the sensor coil in series; and a differentiation circuit for differentiating a voltage generated across the inductance element and outputting a signal corresponding to the magnetic field.

According to the third magnetic sensor apparatus or current sensor apparatus of the invention, the drive means supplies an alternating current to the sensor coil. The differentiation circuit differentiates a voltage generated across the inductance element connected to the sensor coil in series and outputs a signal corresponding to the magnetic field.

According to the third magnetic sensor apparatus or current sensor apparatus, the alternating current may be a current having such a magnitude that the core is driven into a saturation region.

According to the third magnetic sensor apparatus or current sensor apparatus, the magnetic core may be made of ferrite.

A fourth magnetic sensor apparatus or a fourth current sensor apparatus of the invention comprises: a magnetic core; a sensor coil wound around the core and provided for detecting an applied magnetic field to be measured; a drive means having a series resonant circuit part of which is made up of the sensor coil, the drive means driving the sensor coil by supplying a resonant current flowing through the series resonant circuit to the sensor coil; and a current supply means for supplying a second current to the sensor coil, the second current including a direct current, that is, a current having no frequency, and having a frequency different from a resonant frequency of the series resonant circuit.

According to the fourth magnetic sensor apparatus or current sensor apparatus of the invention, the drive means supplies a resonant current flowing through the series resonant circuit part of which is made up of the sensor coil to the sensor coil. The current supply means supplies the second current to the sensor coil. The second current includes a direct current and has a frequency different from the resonant frequency of the series resonant circuit.

According to the fourth magnetic sensor apparatus or current sensor apparatus, the resonant current may be a current having such a magnitude that the core is driven into a saturation region.

According to the fourth magnetic sensor apparatus or current sensor apparatus, the drive means may have an oscillation circuit including the series resonant circuit.

According to the fourth magnetic sensor apparatus or current sensor apparatus, the current supply means may have a second coil that forms part of the series resonant circuit and is connected to the sensor coil in parallel in terms of alternating current when seen from the series resonant circuit, and the current supply means supplies the second current to the sensor coil through the second coil. In this case, the second coil may have an inductance equal to or greater than an inductance of the sensor coil. The current supply means may further have a capacitor connected to the second coil in parallel, and a parallel resonant frequency of the capacitor and the second coil may be set to a frequency nearly equal to the resonant frequency of the series resonant circuit.

The fourth magnetic sensor apparatus or current sensor apparatus may further comprise a detection means for detecting the magnetic field, based on the resonant current flowing through the sensor coil. In this case, the detection means may detect the magnetic field, based on part of the resonant current flowing through the sensor coil that drives the core into a saturation region. The detection means may detect the magnetic field, based on components having asymmetric positive and negative portions of the resonant current flowing through the sensor coil. The detection means may have: an inductance element inserted to the series resonant circuit; and a differentiation circuit for differentiating a voltage generated across the inductance element and outputting a signal corresponding to the magnetic field to be measured.

According to the fourth magnetic sensor apparatus or current sensor apparatus, the current supply means may supply the second current to the sensor coil such that the resonant current flowing through the sensor coil has positive and negative portions constantly symmetric.

A fifth magnetic sensor apparatus or a fifth current sensor apparatus of the invention comprises: a magnetic core; a sensor coil wound around the core and provided for detecting an applied magnetic field to be measured; a drive means for driving the sensor coil by supplying an alternating drive current that drives the core into a saturation region to the sensor coil; a field detection means for detecting the magnetic field by detecting a variation in inductance of the sensor coil; an inductance variation amount detection means for detecting an amount of an inductance variation in the saturation region of the core in an equivalent manner; and a control means for controlling the drive current, based on the amount of the inductance variation detected by the inductance variation amount detection means.

According to the fifth magnetic sensor apparatus or current sensor apparatus of the invention, the drive means drives the sensor coil by supplying an alternating drive current that drives the core into a saturation region to the sensor coil. The field detection means detects the magnetic field by detecting a variation in inductance of the sensor coil. The inductance variation amount detection means detects an amount of an inductance variation in the saturation region of the core in an equivalent manner. The control means controls the drive current, based on the amount of the inductance variation detected by the inductance variation amount detection means.

According to the fifth magnetic sensor apparatus or current sensor apparatus, the control means may control the drive current such that the amount of the inductance variation detected by the inductance variation amount detection means is kept constant.

According to the fifth magnetic sensor apparatus or current sensor apparatus, the control means may control an operation voltage of the drive means in an equivalent manner.

According to the fifth magnetic sensor apparatus or current sensor apparatus, the control means may control an operation point of the drive means in an equivalent manner.

According to the fifth magnetic sensor apparatus or current sensor apparatus, the inductance variation amount detection means may detect the amount of the inductance variation, based on the drive current in the saturation region of the core. In this case, the inductance variation amount detection means may have: an inductance element connected to the sensor coil in series; and a differentiation circuit for differentiating a voltage generated across the inductance element and outputting a signal corresponding to the amount of the inductance variation According to the fifth magnetic sensor apparatus or current sensor apparatus, the field detection means may have: an inductance element connected to the sensor coil in series; and a differentiation circuit for differentiating a voltage generated across the inductance element and outputting a signal corresponding to the magnetic field to be measured.

According to the fifth magnetic sensor apparatus or current sensor apparatus, the drive means may have a self-excited oscillation circuit having a circuit for determining an oscillation time constant part of which is made up of the sensor coil. In this case, the self-excited oscillation circuit may be a Clapp oscillation circuit or a Colpitts oscillation circuit.

The fifth magnetic sensor apparatus or current sensor apparatus may further comprise a negative feedback current supply means for supplying a negative feedback current to the sensor coil. The negative feedback current is used for negative feedback of an output of the field detection means.

Other and further objects, features and advantages of the invention will appear more fully from the following description.

BEST MODES FOR CARRYING OUT THE INVENTION

Figure 1:
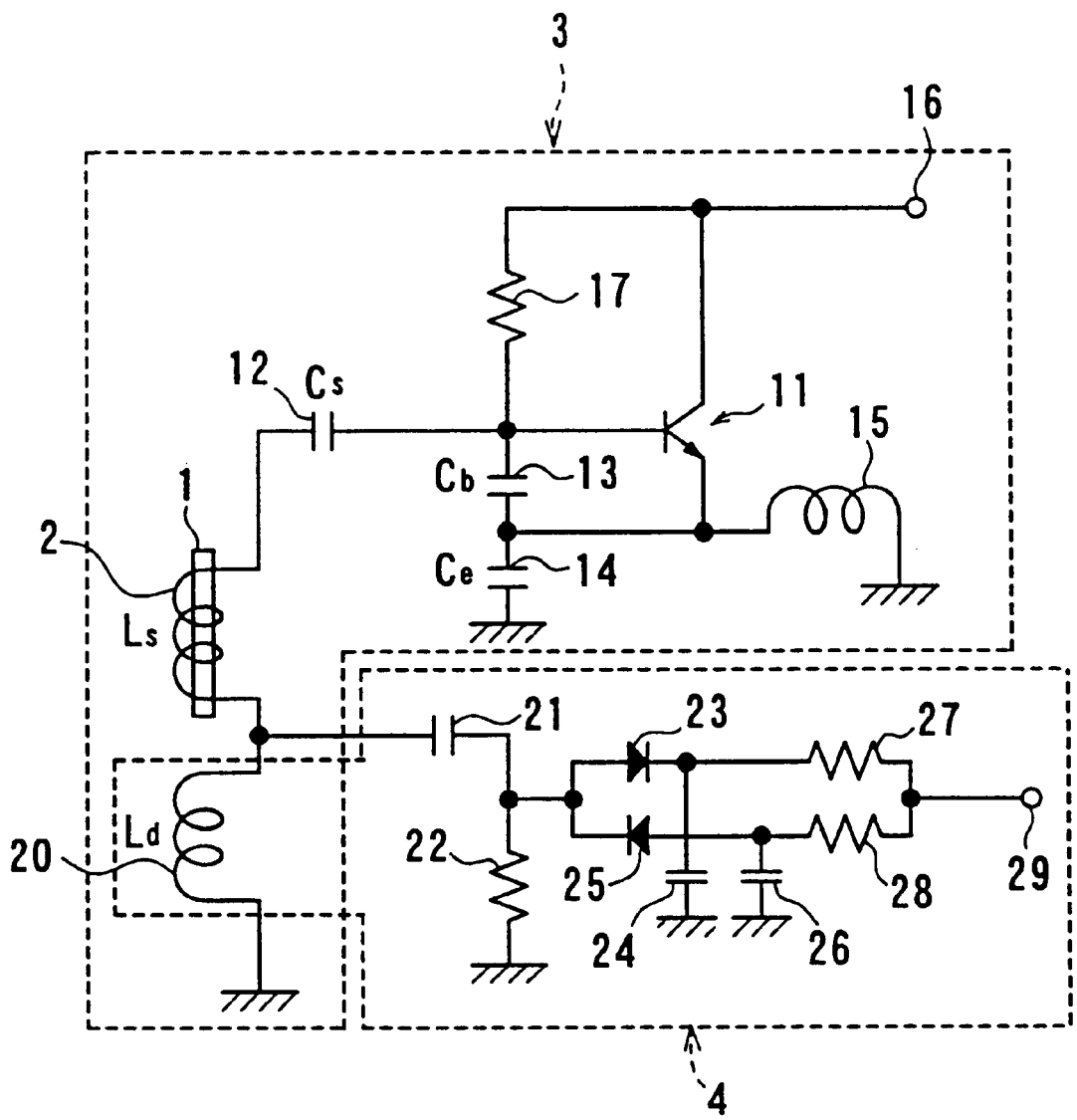
FIG. 1 is a circuit diagram illustrating the configuration of a magnetic sensor apparatus of a first embodiment of the invention.

Preferred embodiments of the invention will now be described in detail with reference to the accompanying drawings.

Summary of the First and Second Embodiments

A summary of first and second embodiments of the invention will now be described. The first embodiment relates to a magnetic sensor apparatus utilizing a fluxgate element. The second embodiment relates to an electric current sensor apparatus utilizing the magnetic sensor apparatus of the first embodiment. The large amplitude excitation method is applied to the first and second embodiments. The magnetic sensor apparatus of the first embodiment comprises: a magnetic core having a magnetic saturation property; a sensor coil wound around the core; a drive circuit, incorporating a series resonant circuit utilizing the sensor coil and a capacitor (condenser), for supplying a resonant current flowing through the series resonant circuit, as an alternating current for driving the core into a saturation region, to the sensor coil; and a detection circuit for detecting a magnetic field to be measured by detecting a variation in resonant current flowing through the sensor coil. The drive circuit has, for example, an oscillation circuit incorporating the series resonant circuit.

Since the sensor coil wound around the core makes up part of the oscillation circuit, a specific alternating current is inevitably supplied to the sensor coil. The specific alternating current is of a value that equals to a current value limited by the supply voltage multiplied by value Q (quality factor) of the resonant circuit. Value Q is 10 to 100 in general. Therefore, according to the first and second embodiments, it is possible to utilize a magnetic core made of ferrite, for example, that exhibits excellent reliability and is provided at a low price through mass-production. In addition, it is possible to supply an alternating current enough to drive the core into saturation to a small-size and inexpensive sensor coil fabricated through ordinary techniques. Furthermore, since a resonant current is utilized, a current flowing through the sensor coil is independent of the frequency of the alternating current. As a result, it is possible to choose any frequency for the alternating current that is required by the frequency response of the magnetic sensor apparatus. For example, the frequency response of the sensor apparatus is improved by increasing the frequency of the alternating current.

However, if a resonant current is used, some means are required for capturing a variation in inductance of the sensor coil as an output signal of the magnetic sensor apparatus. That is, as described above, in the method of detecting a variation in voltage across the sensor coil, a problem is that it is difficult to detect a variation in voltage in a resonant state. In the method of detecting a variation in oscillation frequency, the detection sensitivity is low and not practical since the oscillation frequency is proportional to the square root of the inductance.

In the first and second embodiments of the invention, a method of detecting variations in waveform of resonant current is used for capturing variations in inductance of the sensor coil as an output signal of the magnetic sensor apparatus. To detect variations in waveform of resonant current, a resistor may be inserted to the resonant circuit in series and the voltage across the resistor may be detected. However, if the resistor is inserted to the resonant circuit, value Q of the resonant circuit is reduced and the alternating current (resonant current) exciting the sensor coil falls short. If the resistance is reduced to avoid this, an amplifier that exhibits steady amplification in a wide band is required, and the price of the magnetic sensor apparatus is thereby raised.

In the first and second embodiments of the invention, to detect variations in waveform of resonant current, an inductance element that is used for detection and generates a high saturation current is inserted to the resonant circuit including the sensor coil, and the voltage across the element is differentiated at a differentiation circuit.

First Embodiment

The magnetic sensor apparatus of the first embodiment of the invention will now be described. FIG. 1 is a circuit diagram of the magnetic sensor apparatus of the embodiment.

The magnetic sensor apparatus comprises a magnetic core 1 having a magnetic saturation property and a sensor coil 2 wound around the core 1. An end of a detection coil 20 as an inductance element is connected to an end of the sensor coil 2. The other end of the detection coil 20 is grounded. The magnetic sensor apparatus further comprises: a drive circuit 3 having a series resonance circuit part of which is made up of the sensor coil 2 and supplying a resonant current flowing through the series resonant circuit, as an alternating current for driving the core 1 into a saturation region, to the sensor coil 2; and a detection circuit 4 for detecting a magnetic field to be measured by detecting variations in resonant current flowing through the sensor coil 2.

The drive circuit 3 has an oscillation circuit including the series resonant circuit. The configuration of the oscillation circuit is as follows. The oscillation circuit incorporates a transistor 11. The base of the transistor 11 is connected to the other end of the sensor coil 2 through a capacitor 12 used for resonance. An end of a capacitor 13 used for feedback is connected to the base of the transistor 11. An end of a capacitor 14 used for feedback and the emitter of the transistor 11 are connected to the other end of the capacitor 13. The other end of the capacitor 14 is grounded. The emitter of the transistor 11 is grounded through a load coil 15. The collector of the transistor 11 is connected to a power input 16 and to the base through a bias resistor 17. The configuration of this oscillation circuit is that of a Clapp oscillation circuit where Cs<<Cb and Cs<<Ce, the capacitance of each of the capacitors 12, 13 and 14 being Cs, Cb and Ce, respectively.

The configuration of the detection circuit 4 is as follows. An end of a capacitor 21 is connected to the connection point between the sensor coil 2 and the detection coil 20. The other end of the capacitor 21 is grounded through a resistor 22. The capacitor 21 and the resistor 22 make up a differentiation circuit for differentiating the voltage generated across the coil 20 and outputting a signal corresponding to the magnetic field to be measured.

The anode of a diode 23 and the cathode of a diode 25 are connected to the connection point between the capacitor 21 and the resistor 22. The cathode of the diode 23 is grounded through a capacitor 24. The anode of the diode 25 is grounded though a capacitor 26. The diode 23 and the capacitor 23 make up a positive peak hold circuit. The diode 25 and the capacitor 26 make up a negative peak hold circuit.

The connection point between the diode 23 and the capacitor 24 is connected to a detection output 29 through a resistor 27. The connection point between the diode 25 and the capacitor 26 is connected to the detection output 29 through a resistor 28. The resistors 27 and 28 make up a resistor adding circuit for adding a positive output value held at the positive peak hold circuit to a negative output value held at the negative peak hold circuit. The output voltage of the detection output 29 may be equal to or greater than the supply voltage of the magnetic sensor apparatus.

The detection coil 20 is not only part of the oscillation circuit as the drive circuit 3 but also part of the detection circuit 4.

Specific examples of the components of the magnetic sensor apparatus shown in FIG. 1 will now be described. The magnetic core 1 is a rod-shaped core made of Ni—Cu—Zn-base ferrite having a diameter of 0.8 mm and a length of 2.5 mm. The sensor coil 2 is made of 250 turns of urethane-coated lead wire having a diameter of 0.03 mm wound around the core 1 stated above, for example. Inductance Ls of the sensor coil 2 is 500 $\mu$H. A coil current that reduces the inductance to one-half is 60 mA. The core 1 may be drum-shaped or have any other shape, in addition to the shape of a rod.

The detection coil 20 is an inductance element that is commercially available whose inductance Ld is 22 $\mu$H. Since Ld<<Ls, the oscillation frequency of the oscillation circuit is basically determined by inductance Ls of the sensor coil 2 and capacitance Cs of the capacitor 12. When Cs equals to 2700 pF, the oscillation frequency, that is, the excitation frequency of the magnetic sensor apparatus is 150 kHz. Since sampling is made at two points of positive and negative for one cycle of excitation current in the magnetic sensor apparatus utilizing a fluxgate, the sampling frequency is twice the excitation frequency. The Nyquist frequency that is the threshold response frequency is half the sampling frequency. Accordingly, the Nyquist frequency of the magnetic sensor apparatus is 150 kHz. However, it is possible to increase the oscillation frequency up to around 500 kHz as long as the withstand voltage of the sensor coil 2 and the capacitor 12 is carefully considered.

The amplitude of oscillation at the connection point between the sensor coil 2 and the capacitor 12 obtained by measurement is 60 $V_{p-p}$ when the operation voltage of the circuit is 5 V. Since the impedance of the inductance of (500+22) $\mu$H of the sensor coil 2 and the detection coil 20 is 492 ohm at 150 kHz, the sensor coil 2 is driven by an alternating current of 122 $mA_{p-p}$, that is, about ±60 mA and the core 1 is driven into the saturation region.

The operation of the magnetic sensor apparatus of the embodiment will now be described. An alternating current is supplied to the sensor coil 2 by the oscillation circuit as the drive circuit 3 such that the core 1 is driven into the saturation region. The alternating current is a resonant current that is equal to the current value limited by the supply voltage multiplied by value Q of the resonant circuit. A method taken in this embodiment is to detect variations in waveform of resonant current as a method of capturing variations in inductance of the sensor coil 2 as an output signal of the magnetic sensor apparatus. To be specific, the voltage across the detection coil 20 connected to the sensor coil 2 in series and having a large saturation current is differentiated at the differentiation circuit made up of the capacitor 21 and the resistor 22. A positive output value of an output of the differentiation circuit is held at the positive peak hold circuit made up of the diode 23 and the capacitor 24. A negative output value of the output of the differentiation circuit is held at the negative peak hold circuit made up of the diode 25 and the capacitor 26. The positive and negative output values are added to each other at the resistor adding circuit made up of the resistors 27 and 28. The result is outputted from the detection output 29.

Figure 2A:
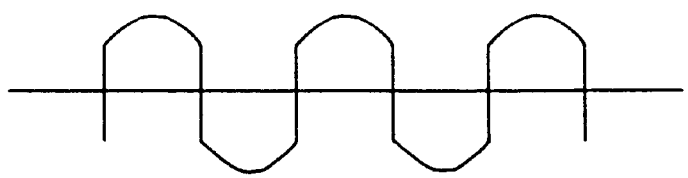
FIG. 2A to FIG. 2F are waveform plots for describing the operation of the magnetic sensor apparatus of the first embodiment.
Figure 2B:
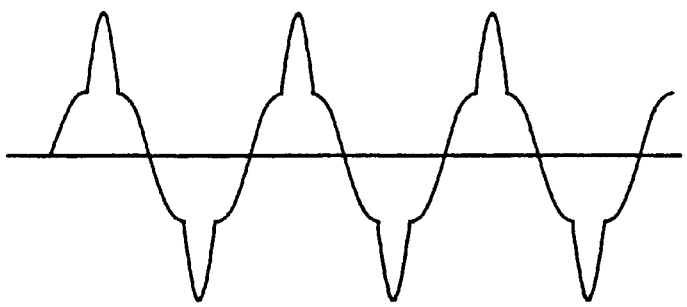

FIG. 2A to FIG. 2F are waveform plots for describing the operation of the magnetic sensor apparatus of the embodiment. FIG. 2A illustrates a voltage waveform across the detection coil 20 when no external magnetic field is present. FIG. 2B is a differential waveform of the voltage waveform shown in FIG. 2A. As shown, the sum of positive and negative peak values (the difference between the absolute values) of the differential waveform is zero when no external magnetic field is present.

Figure 2C:
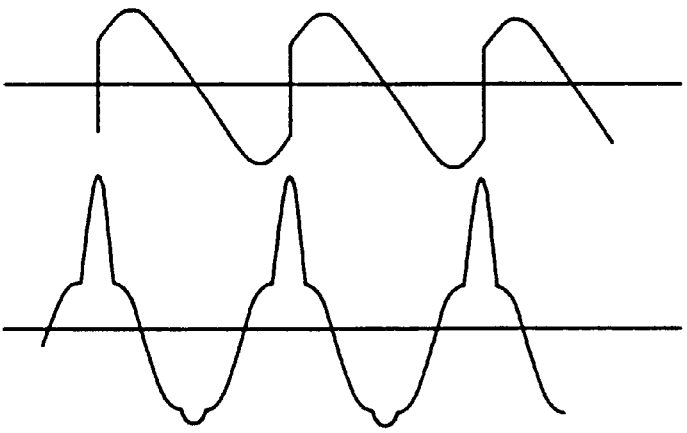
Figure 2D:
Figure 2E:
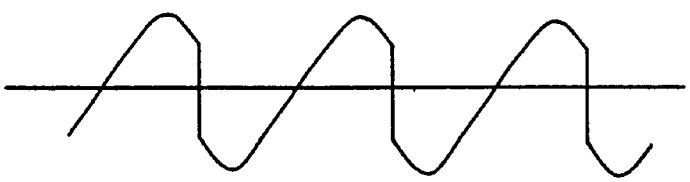
Figure 2F:
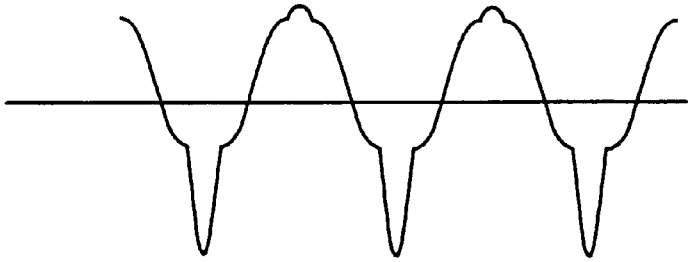

FIG. 2C illustrates a voltage waveform across the detection coil 20 when an external magnetic field in a specific direction is applied to the sensor coil 2. FIG. 2D is a differential waveform of the voltage waveform shown in FIG. 2C. FIG. 2E illustrates a voltage waveform across the detection coil 20 when an external magnetic field in a direction opposite to the direction in the case of FIG. 2C is applied to the sensor coil 2. FIG. 2F is a differential waveform of the voltage waveform shown in FIG. 2E. As shown, each differential waveform is asymmetric with respect to the zero level when the external field is applied to the sensor coil 2. As a result, the sum of positive and negative peak values (the difference between the absolute values) of the differential waveform is other than zero, which depends on the external magnetic field. According to the embodiment, in such a manner, the external magnetic field is measured by obtaining the sum of positive and negative peak values (the difference between the absolute values) of the differential waveform.

According to the embodiment thus described, a resonant current of the resonant circuit is supplied to the sensor coil 2. As a result, an alternating current that drives the core 1 into the saturation region is easily supplied to the sensor coil 2. In addition, the configuration of the apparatus is simple since it is not required to wind any coil for excitation around the core 1 besides the sensor coil 2.

According to the embodiment, a detection output of the order of volts is easily obtained by inserting the detection coil 20 to the resonant circuit, without reducing value Q of the resonant circuit, that is, without causing insufficiency in resonant current supplied to the sensor coil 2. In addition, the peak hold circuit is implemented by the simple and inexpensive one utilizing the diode and the capacitor. The detection coil 20 is able to obtain a sufficiently large output even when the inductance value thereof is less than ten percent of the inductance value of the sensor coil 2. Therefore, since the number of turns of the detection coil 20 is small and the saturation current value is sufficiently large in general, the detection coil 20 will not be saturated by the drive current (resonant current) of the sensor coil 2.

The features of the magnetic sensor apparatus of the embodiment are listed below.

(1) The apparatus exhibits excellent properties since the large amplitude excitation method is applied.

(2) Long-term reliability is achieved since a magnetic core made of a material, such as ferrite well known for its reliability lasting for a period as long as ten years or more, is used.

(3) No special method is required for fabricating the sensor section.

(4) Since resonant current is utilized, the sensor coil is driven at a low supply voltage and a high frequency.

(5) No special material or method is required for fabricating the apparatus and the circuit is very simple. As a result, the apparatus is manufactured at an extremely low cost and it is possible to meet the great demand.

(6) The apparatus has an excellent frequency response.

(7) Power consumption is low since resonant current is used.

(8) The apparatus is small and light-weight since the configuration is simple.

As thus described, the magnetic sensor apparatus of the embodiment is very effective for application to an electric car or controlling direct current in solar-electric power generation.

Reference is now made to FIG. 3 to FIG. 6 to describe some modification examples of the embodiment.

Although the Clapp oscillation circuit is used as the oscillation circuit in the magnetic sensor apparatus shown in FIG. 1, a Colpitts oscillation circuit may be used if the saturation current value of the sensor coil 2 is small and the drive voltage may be low. The Colpitts oscillation circuit has a configuration similar to that of the circuit shown in FIG. 1 and is implemented where the relationship among capacitance Cs, Cb and Ce of the capacitors 12, 13 and 14 is Cb<<Cs and Ce<<Cs.

Figure 3:
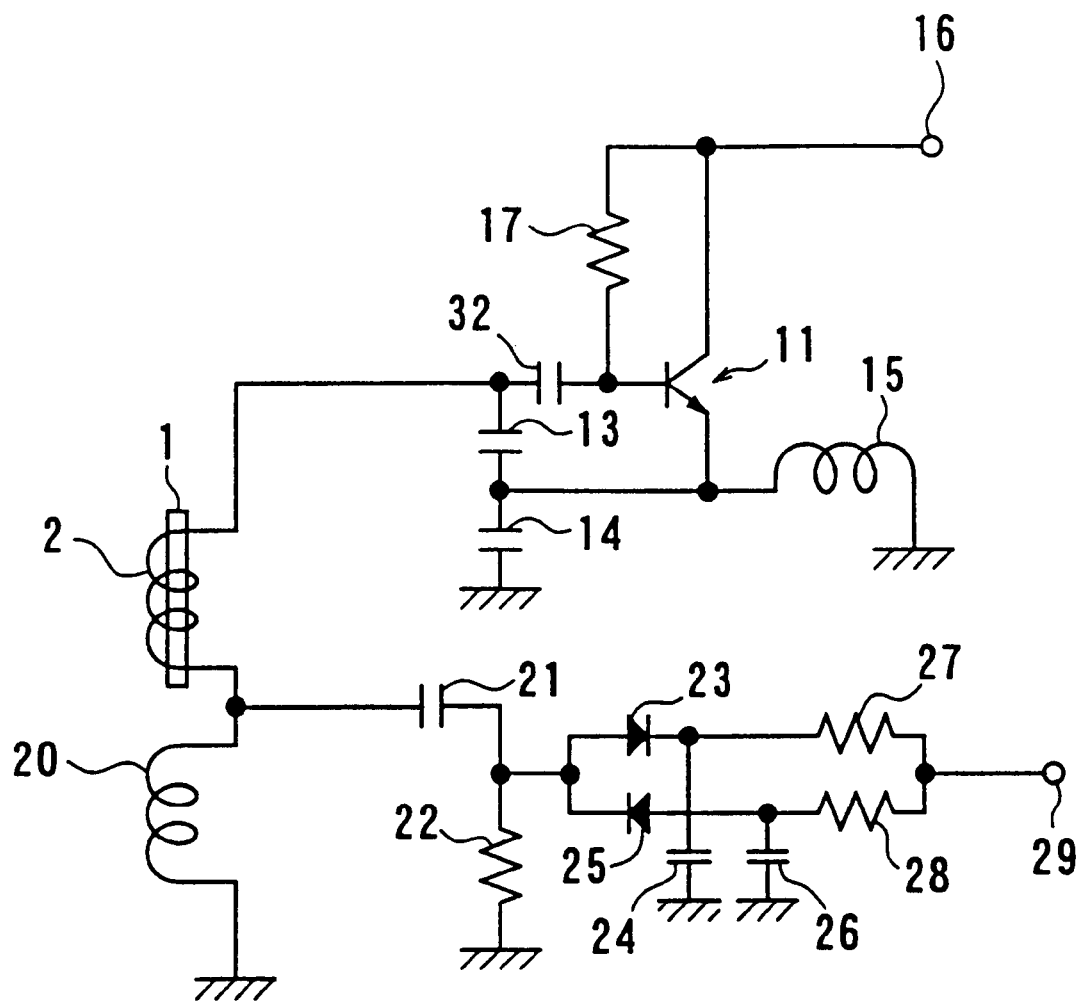
FIG. 3 is a circuit diagram illustrating the configuration of a modification example of the magnetic sensor apparatus of the first embodiment.

In the Colpitts circuit, the capacitor 12 is not used for resonance but used for cutting off direct current. Therefore, the circuit of the magnetic sensor apparatus may have a configuration shown in FIG. 3 if the Colpitts oscillation circuit is used. The circuit shown in FIG. 3 is similar to the one shown in FIG. 1 except that the capacitor 12 is eliminated while a capacitor 32 is provided. The base of the transistor 11 and an end of the resistor 17 are connected to an end of the capacitor 32. The other end of the capacitor 32 is connected to the connection point of the sensor coil 2 and the capacitor 13.

Figure 4:
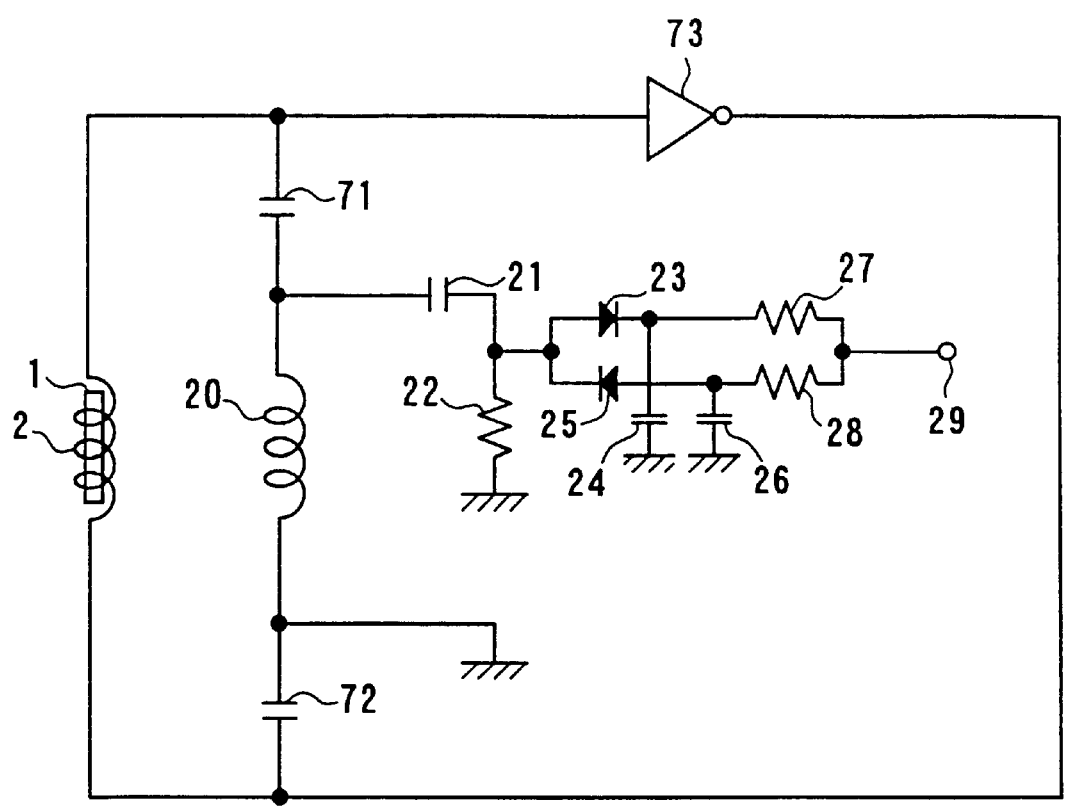
FIG. 4 is a circuit diagram illustrating the configuration of another modification example of the magnetic sensor apparatus of the first embodiment.

FIG. 4 is an example of circuit configuration of the magnetic sensor apparatus using a Colpitts oscillation circuit having another configuration. In this example an inverter is used in the Colpitts circuit. In the apparatus shown in FIG. 4, an end of a capacitor 71 and an input of the inverter 73 are connected to an end of the sensor coil 2. An end of the detection coil 20 is connected to the other end of the capacitor 71. An end of a capacitor 72 is connected to the other end of the detection coil 20. The other end of the capacitor 72 is connected to the other end of the sensor coil 2 and to an output of the inverter 73. An end of the capacitor 21 of the differentiation circuit is connected to an end of the detection coil 20. The other end of the detection coil 20 is grounded. As in the example shown in FIG. 4, it is not necessary that the detection coil 20 is directly connected to the sensor coil 2 but it is acceptable as long as the detection coil 20 is inserted to the resonant circuit.

Figure 5:
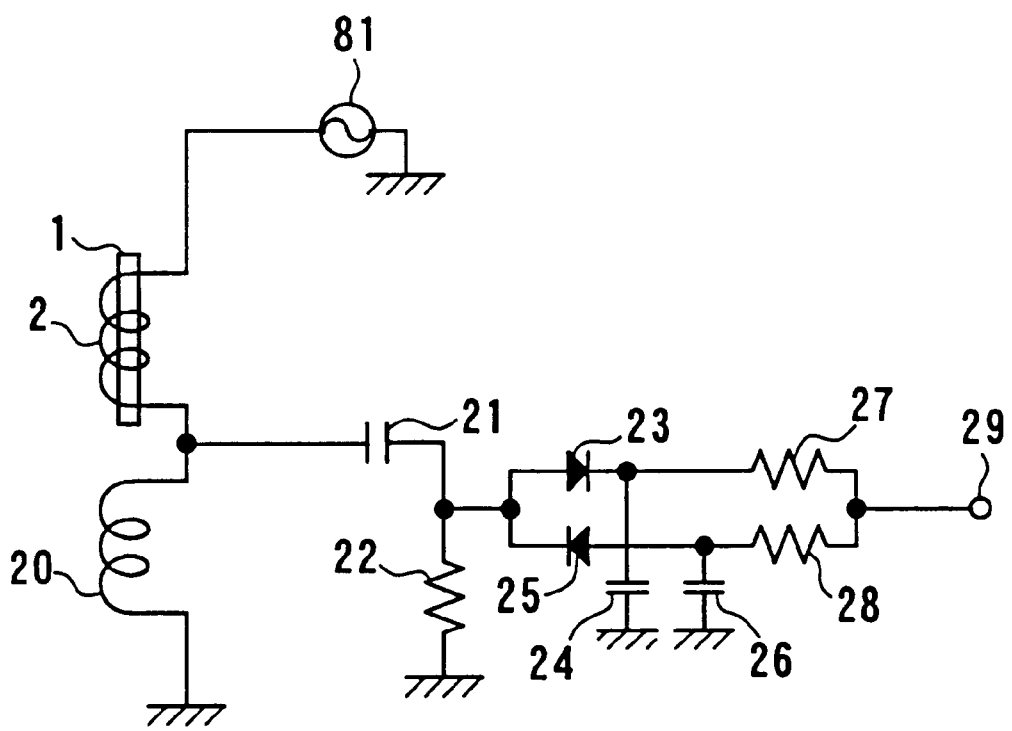
FIG. 5 is a circuit diagram illustrating the configuration of still another modification example of the magnetic sensor apparatus of the first embodiment.

In a magnetic sensor apparatus shown in FIG. 5, an alternating current power source 81 is used as the drive circuit, instead of the oscillation circuit shown in FIG. 1. An end of the power source 81 is connected to the other end of the sensor coil 2. The other end of the power source 81 is grounded.

Figure 6:
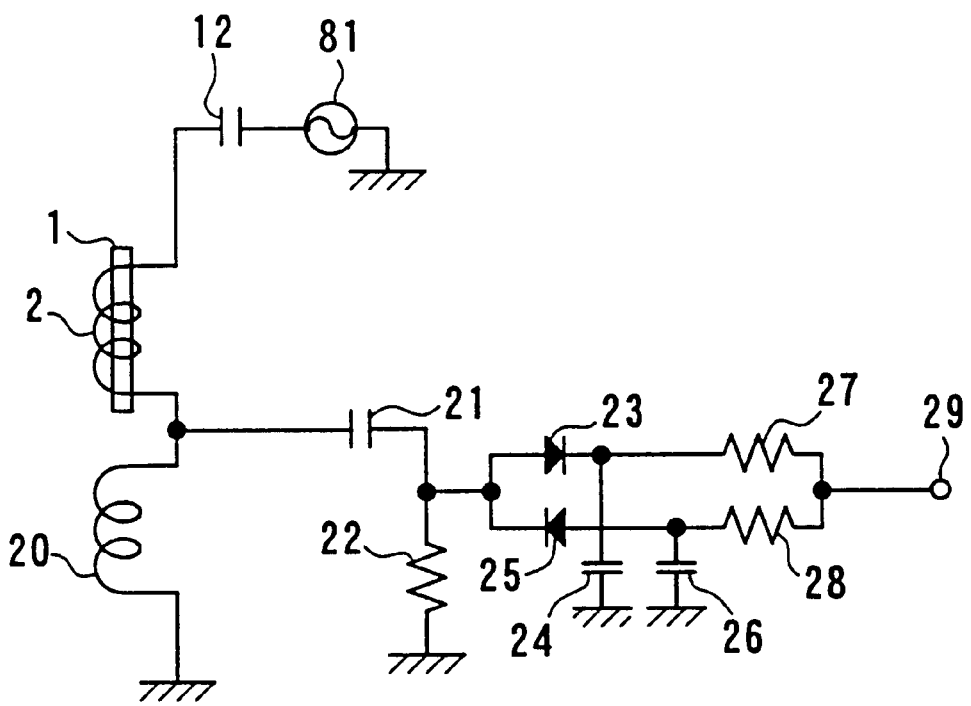
FIG. 6 is a circuit diagram illustrating the configuration of still another modification example of the magnetic sensor apparatus of the first embodiment.

In a magnetic sensor apparatus shown in FIG. 6, the capacitor 12 used for resonance is connected to the other end of the sensor coil 2 to make up a series resonant circuit, and the alternating current power source 81 is provided for supplying an alternating current tuned to the resonant frequency to the series resonant circuit. An end of the power source 81 is connected to the other end of the sensor coil 2 through the capacitor 12. The other end of the power source 81 is grounded.

Second Embodiment

Figure 7:
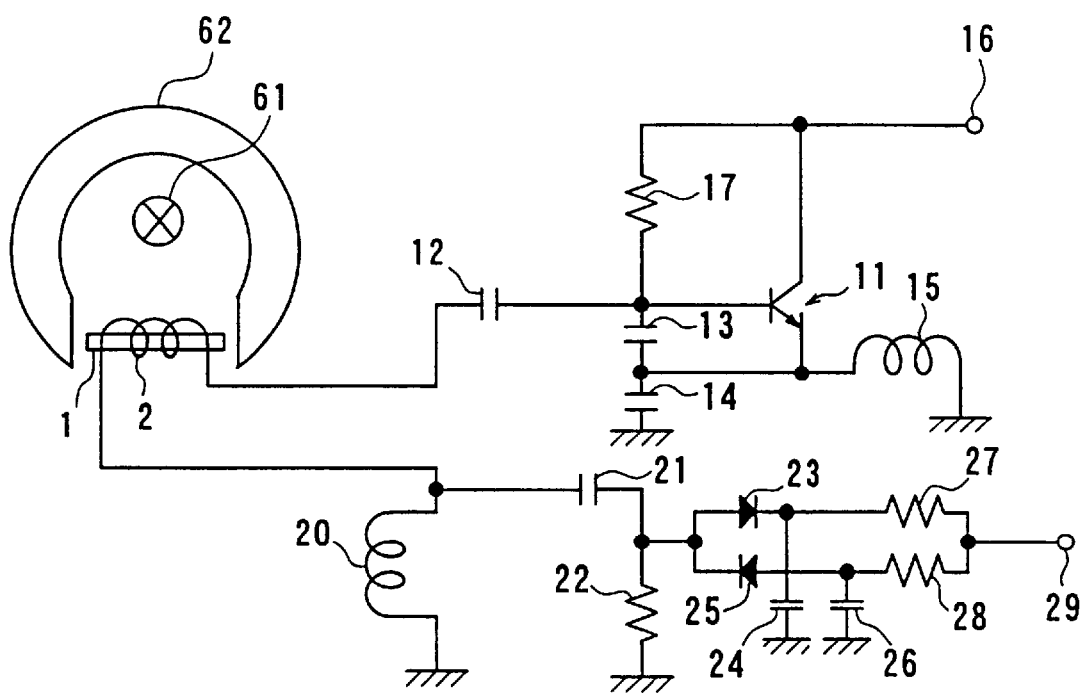
FIG. 7 is a circuit diagram illustrating the configuration of a current sensor apparatus of a second embodiment of the invention.

A current sensor apparatus of the second embodiment of the invention will now be described. FIG. 7 is a circuit diagram of the current sensor apparatus. The current sensor apparatus incorporates the magnetic sensor apparatus of the first embodiment.

The current sensor apparatus comprises a magnetic yoke 62 that surrounds a conductor 61 through which a current to be measured passes. Part of the yoke 62 has a gap. In the gap of the yoke 62, the core 1 and the sensor coil 2 of the magnetic sensor apparatus of the first embodiment are placed. The remainder of the configuration of the current sensor apparatus is similar to that of the magnetic sensor apparatus of the first embodiment.

A specific example of the current sensor apparatus actually fabricated will now be described. In this example, the yoke 62 is a toroidal core made of Mn—Zn-base ferrite. The yoke 62 has an outer diameter of 20 mm, an inner diameter of 10 mm and a thickness of 5 mm and has a gap of 8 mm in width. In this example the dimensions of the entire apparatus are 20 mm by 30 mm by 6 mm and very small. The apparatus is operated at a single power source of +5 V. Current consumption is 25 mA. The weight is 9 g.

Figure 8:
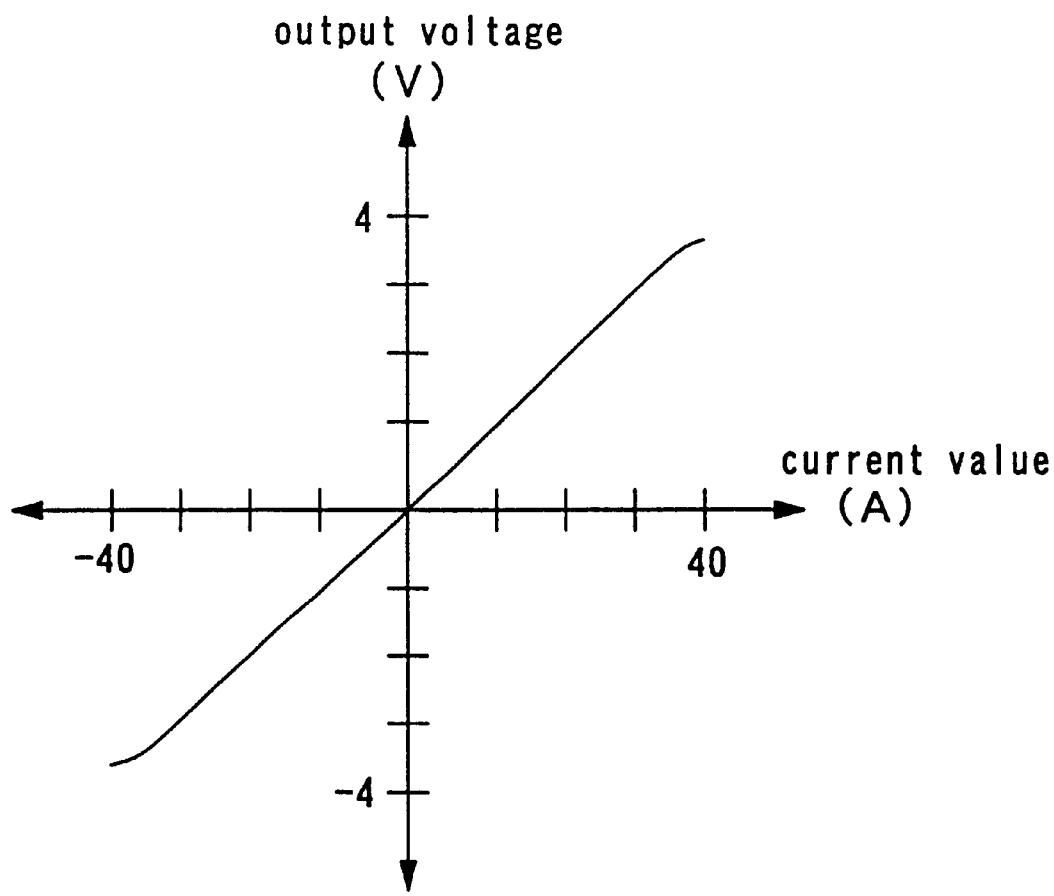
FIG. 8 is a plot illustrating an example of a characteristic of the current sensor apparatus of the second embodiment.

FIG. 8 shows an example of the relationship between an output voltage of the current sensor apparatus of the embodiment and a current to be measured passing through the conductor 61 placed inside the magnetic yoke 62 of the sensor apparatus. As shown, a linear output voltage characteristic is obtained in a good condition in a wide current range, according to the current sensor apparatus. The apparatus is therefore highly effective for application to an electric car or controlling direct current in solar-electric power generation.

The remainder of function and effects of the embodiment are similar to those of the first embodiment.

The configurations of the drive circuit 3 and the detection circuit of the first and second embodiments are given as examples and may be practiced in still other ways through the use of known techniques.

According to the magnetic sensor apparatus of the invention including the first embodiment or the current sensor apparatus of the invention including the second embodiment, the drive means supplies a resonant current flowing through the series resonant circuit incorporating the sensor coil to the sensor coil. The resonant current is an alternating current that drives the magnetic core into the saturation region. The detection means then detects variations in the resonant current passing through the sensor coil in order to detect a magnetic field to be measured. As a result, it is possible to provide the magnetic sensor apparatus or the current sensor apparatus that is inexpensive and has excellent properties and long-term reliability.

The inductance element may be inserted to the series resonant circuit and a signal corresponding to a magnetic field to be measured may be detected by differentiating the voltage across the inductance element. In this case, it is possible to detect the magnetic field without causing insufficiency in resonant current supplied to the sensor coil.

The drive means may incorporate the oscillation circuit including the series resonant circuit. As a result, it is possible to drive the sensor coil at a low supply voltage.

According to the magnetic sensor apparatus of the invention including the first embodiment or the current sensor apparatus of the invention including the second embodiment, the drive means supplies an alternating current that drives the magnetic core into the saturation region to the sensor coil. The differentiating circuit differentiates the voltage across the inductance element connected to the sensor coil in series in order to detect a signal corresponding to a magnetic field to be measured. As a result, it is possible to supply the resonant current to the sensor coil and to detect the magnetic field without causing insufficiency in resonant current. It is thus possible to provide the magnetic sensor apparatus or the current sensor apparatus that is inexpensive and has excellent properties and long-term reliability.

If the magnetic core is made of ferrite, long-term reliability is further improved.

Summary of the Third and Fourth Embodiments

A summary of third and fourth embodiments of the invention will now be described. The third embodiment relates to a magnetic sensor apparatus utilizing a fluxgate element. The fourth embodiment relates to an electric current sensor apparatus utilizing the magnetic sensor apparatus of the third embodiment.

In the third and fourth embodiments of the invention, as in the first and second embodiments, the oscillation circuit including the series resonant circuit having the sensor coil and the capacitor is used. The oscillation circuit is the means for supplying an alternating current that drives the magnetic core into the saturation region to the sensor coil. A resonant current flowing through the series resonant circuit is thereby supplied to the sensor coil.

In the third and fourth embodiments, variations in inductance of the sensor coil are detected from the current values or waveform of the resonant current. In this manner, an output signal corresponding to the external magnetic field is obtained from the sensor coil as a fluxgate element.

If magnetomotive force in the direction opposite to the external magnetic field is applied to the sensor coil, the sensor coil is constantly operated in the state in which an applied magnetic field is zero. The negative feedback method is thus implemented.

To implement the negative feedback method, in general, a method may be taken to wind a sensor coil and a feedback coil around one magnetic core and supply a feedback current to the feedback coil from a voltage source. However, the following problem arises when a resonant current is supplied to the sensor coil by means of an oscillation circuit. In this method, the sensor coil is electromagnetically coupled to the feedback coil through the magnetic core. In addition, the impedance of the voltage source is generally low. As a result, the resonant current is shunted toward the feedback coil and the oscillation voltage is lowered and oscillation is stopped. It is therefore impossible to adopt the method using the feedback coil.

In the third and fourth embodiments, a feedback current is supplied to the sensor coil. Since the sensor coil forms part of the resonant circuit, it is required to take a method for supplying a feedback current to the sensor coil without causing a loss of resonant current.

Accordingly, a method may be taken to supply a feedback current to the sensor coil at high impedance with respect to the frequency of the resonant current. One of the methods for supplying a current at high impedance is to use a constant current circuit or a choke coil of high inductance.

Since a large resonant voltage is generated at the sensor coil, the method of using the constant current circuit is applicable when the saturation current value of the sensor coil is small and the resonant voltage is low. The method of using the choke coil is applicable when the resonant frequency is sufficiently high and the shape and price of the choke coil do not cause great problems.

Figure 10:
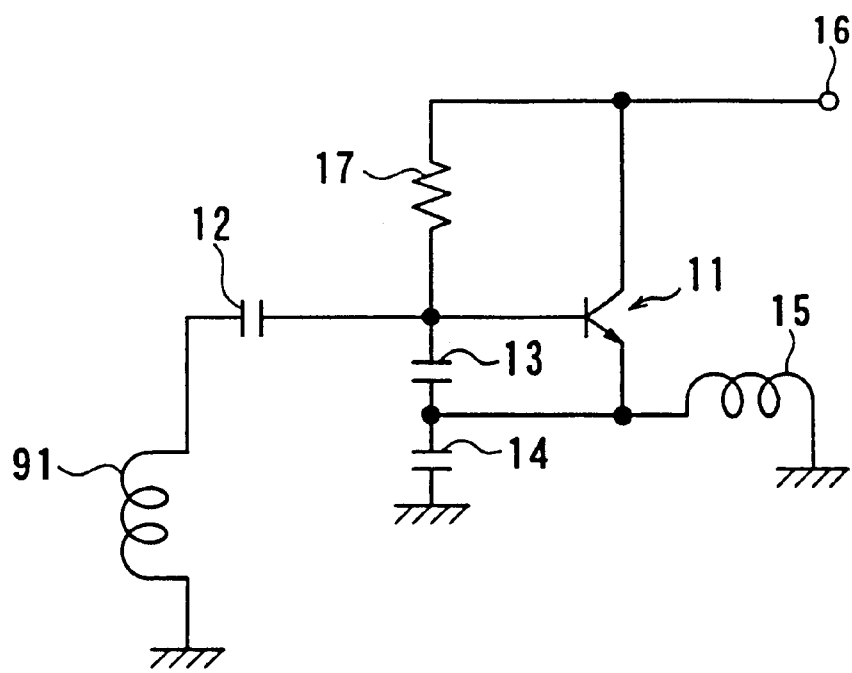
FIG. 10 is an explanatory view for describing a method of supplying a feedback current of the third and fourth embodiments of the invention.
Figure 11:
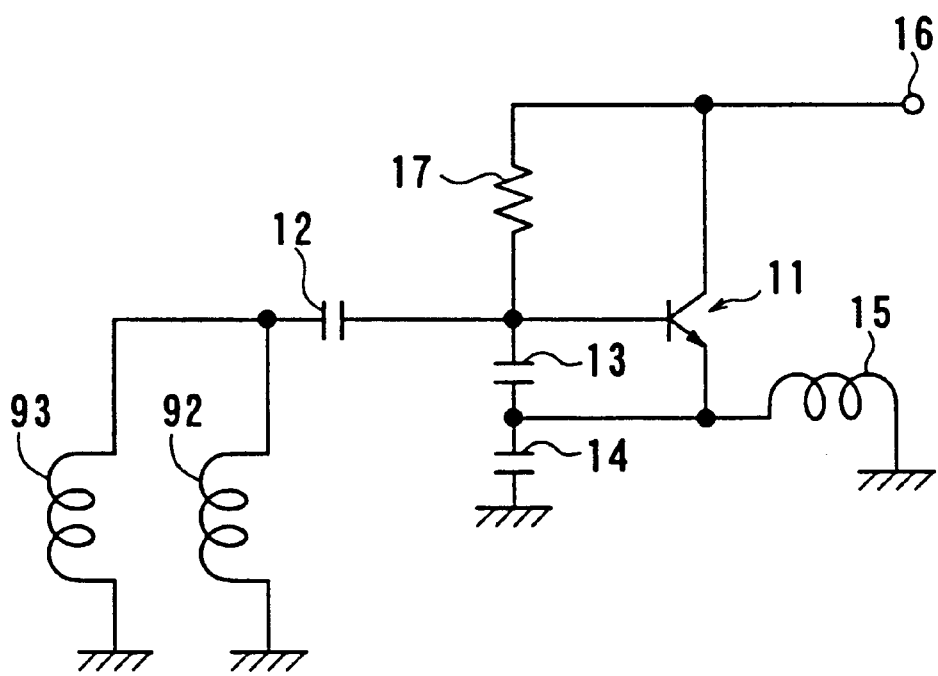
FIG. 11 is an explanatory view for describing a method of supplying a feedback current of the third and fourth embodiments.
Figure 12:
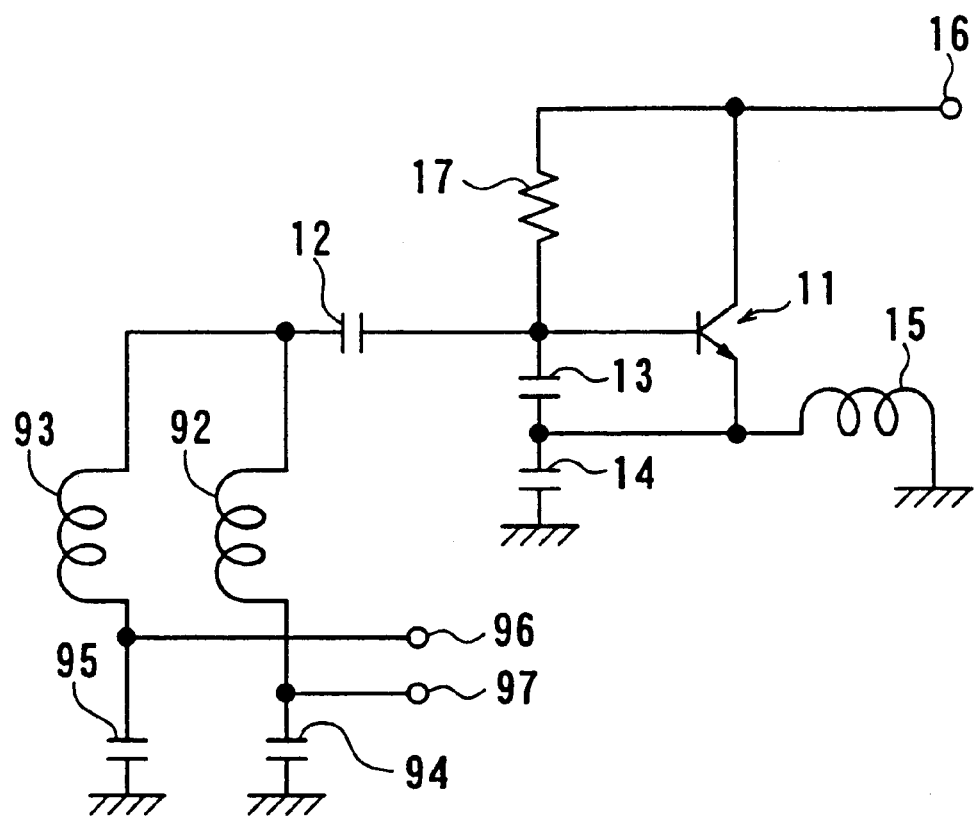
FIG. 12 is an explanatory view for describing the method of supplying a feedback current of the third and fourth embodiments.

In the third and fourth embodiments, a feedback current is supplied to the sensor coil through a method better than the method of using the constant current circuit or the choke coil described above. Reference is now made to FIG. 10 to FIG. 12 to describe the method of supplying a feedback current of the third and fourth embodiments.

A Clapp oscillation circuit or a Colpitts oscillation circuit is most desirable for the oscillation circuit used in the third and fourth embodiments. FIG. 10 is a circuit diagram of an example of the Clapp oscillation circuit. The oscillation circuit comprises a coil 91 for resonance and the capacitor 12 for resonance that make up a series resonant circuit. An end of the coil 91 is grounded while the other end thereof is connected to an end of the capacitor 12. The oscillation circuit further includes the transistor 11. The base of the transistor 11 is connected to the other end of the capacitor 12. An end of the capacitor 13 used for feedback is connected to the base of the transistor 11. An end of the capacitor 14 used for feedback and the emitter of the transistor 11 are connected to the other end of the capacitor 13. The other end of the capacitor 14 is grounded. The emitter of the transistor 11 is grounded through the load coil 15. The collector of the transistor 11 is connected to the power input 16 and to the base through the bias resistor 17. In this Clapp oscillation circuit, the relation of Cs<<Cb and Cs<<Ce is held where the capacitance of each of the capacitors 12, 13 and 14 is Cs, Cb and Ce, respectively. The oscillation circuit may be a Colpitts oscillation circuit. The Colpitts oscillation circuit is implemented by a circuit having a configuration similar to that of the circuit shown in FIG. 10 wherein the relation of Cb<<Cs and Ce<<Cs is held where the capacitance of each of the capacitors 12, 13 and 14 is Cs, Cb and Ce, respectively.

In the oscillation circuit shown in FIG. 10, the electric potential at an end of the coil 91 is the ground potential.

As shown in FIG. 11, a configuration will now be considered wherein the coil 91 of FIG. 10 is replaced with two coils 92 and 93 connected in parallel. In this configuration the electric potential at an end of each of the coils 92 and 93 is the ground potential. The other end of each of the coils 92 and 93 is connected to the capacitor 12.

Since the grounded ends of the coils 92 and 93 may be grounded at the impedance sufficiently low with respect to the oscillation frequency, it is possible to insert each of capacitors 94 and 95 between the end of each of the coils 92 and 93 and the ground surface as shown in FIG. 12. Consequently, the grounded ends 96 and 97 of the two coils 92 and 93 are independent of a direct current or an alternating current signal whose frequency is sufficiently low compared to the oscillation frequency. Seen from the two points 96 and 97, the two coils 92 and 93 make up a series connection circuit of the coils 92 and 93. Moreover, since the points 96 and 97 are originally ground points, the resonant circuit will not be affected even if a current supply circuit of low impedance is connected between the points 96 and 97 or between the point 96 or 97 and the ground surface. Therefore, it is the most desirable feedback current supply method to make the two points (one of which may be grounded or maintained at a constant potential) the supply points of feedback current.

If one of the coils 92 and 93 is a sensor coil, a common resonant voltage is applied to the coils 92 and 93. As a result, if the inductance of the other coil (hereinafter called the second coil) is smaller than the inductance of the sensor coil, a current passing through the second coil that is unrelated to detection of an external magnetic field increases and power consumption increases. Therefore, in order to reduce power consumption, it is preferred that the inductance of the second coil is not smaller than that of the sensor coil, that is, equal to or greater than that of the sensor coil. If the inductance of the second coil is sufficiently greater than that of the sensor coil, the inductance is equal to that of the feedback current supply method using a choke coil.

Furthermore, the current passing through the second coil is reduced if a capacitor is connected to the second coil in parallel and the parallel resonant frequency of the capacitor and the second coil is set to a value nearly equal to the resonant frequency of the series resonant circuit defined by the sensor coil and the capacitor for resonance (that is, the oscillation frequency of the oscillation circuit).

Third Embodiment

Figure 9:
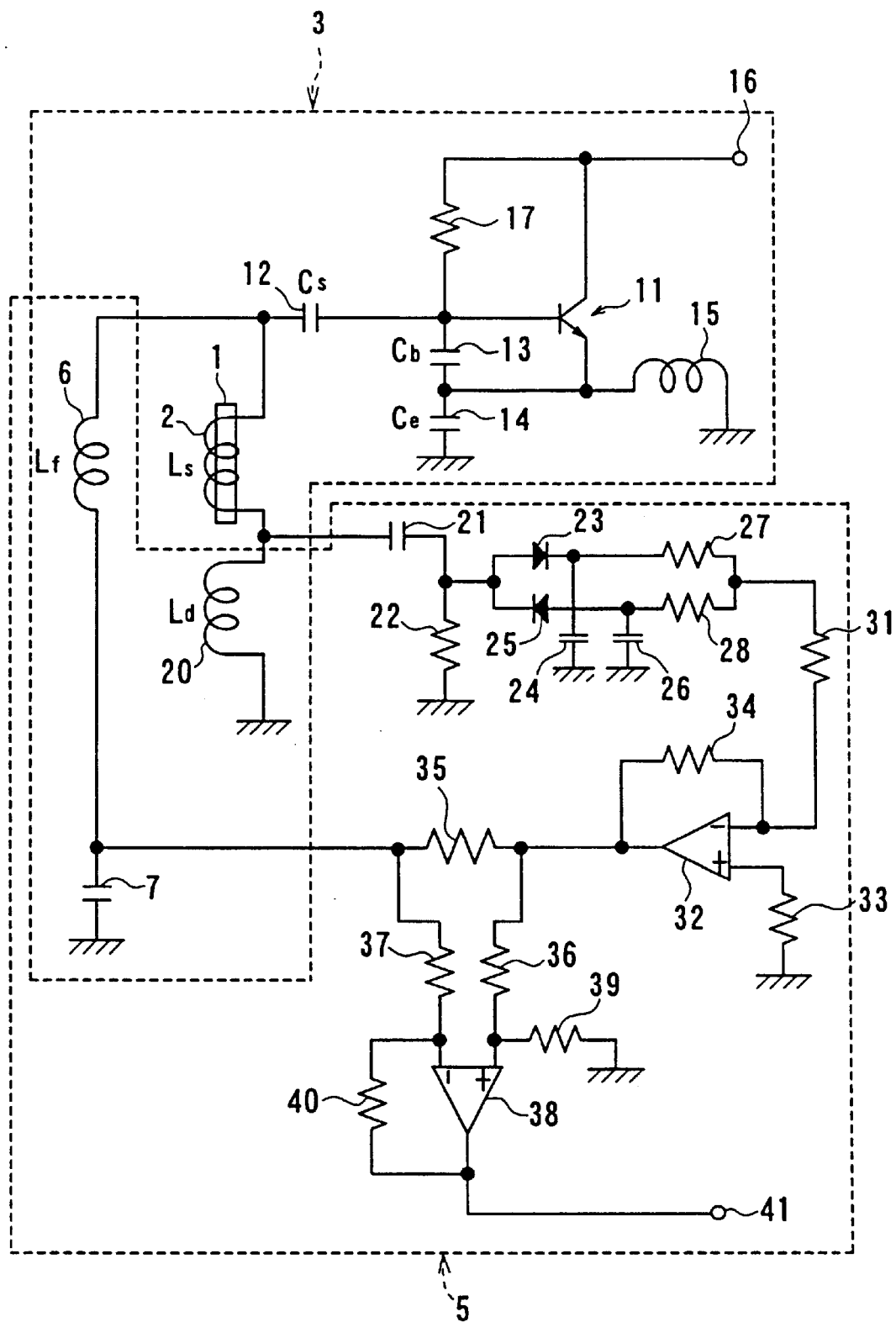
FIG. 9 is a circuit diagram illustrating the configuration of a magnetic sensor apparatus of a third embodiment of the invention.

The magnetic sensor apparatus of the third embodiment of the invention will now be described. FIG. 9 is a circuit diagram of the magnetic sensor apparatus of the embodiment. Positive and negative power supply circuits for an operational amplifier are not shown, according to the practice (in FIG. 13 and FIG. 14, either).

The magnetic sensor apparatus comprises the magnetic core 1 having a magnetic saturation property and the sensor coil 2 wound around the core 1. An end of the detection coil 20 is connected to an end of the sensor coil 2. The other end of the detection coil 20 is grounded. An end of a coil 6 used for a feedback current path as an inductance element is connected to the other end of the sensor coil 2. The other end of the coil 6 is grounded through a capacitor 7. When seen from the series resonant circuit, the coil 6 is connected to the sensor coil 2 in parallel in terms of alternating current. When seen from the sensor coil 2, the coil 6 is connected to the sensor coil 2 in series.

The magnetic sensor apparatus further comprises: the drive circuit 3 having the series resonant circuit part of which is made up of the sensor coil 2 and supplying a resonant current flowing through the series resonant circuit, as an alternating current for driving the core 1 into a saturation region, to the sensor coil 2; and a detection and feedback circuit 5 for detecting a magnetic field to be measured by detecting variations in resonant current flowing through the sensor coil 2 and for supplying a feedback current used for the negative feedback method to the sensor coil 2.

The drive circuit 3 has the oscillation circuit including the series resonant circuit. The configuration of the oscillation circuit is as follows. The oscillation circuit incorporates the transistor 11. The base of the transistor 11 is connected to the other end of the sensor coil 2 through the capacitor 12 used for resonance. An end of the capacitor 13 used for feedback is connected to the base of the transistor 11. An end of the capacitor 14 used for feedback and the emitter of the transistor 11 are connected to the other end of the capacitor 13. The other end of the capacitor 14 is grounded. The emitter of the transistor 11 is grounded through the load coil 15. The collector of the transistor 11 is connected to the power input 16 and to the base through the bias resistor 17. The configuration of this oscillation circuit is that of a Clapp oscillation circuit wherein Cs<<Cb and Cs<<Ce, the capacitance of each of the capacitors 12, 13 and 14 being Cs, Cb and Ce, respectively.

The configuration of the detection and feedback circuit 5 is as follows. An end of the capacitor 21 is connected to the connection point between the sensor coil 2 and the detection coil 20. The other end of the capacitor 21 is grounded through the resistor 22. The capacitor 21 and the resistor 22 make up a differentiation circuit for differentiating the voltage generated across the coil 20 and outputting a signal corresponding to the magnetic field to be measured.

The anode of the diode 23 and the cathode of the diode 25 are connected to the connection point between the capacitor 21 and the resistor 22. The cathode of the diode 23 is grounded through the capacitor 24. The anode of the diode 25 is grounded though the capacitor 26. The diode 23 and the capacitor 24 make up the positive peak hold circuit. The diode 25 and the capacitor 26 make up the negative peak hold circuit.

An end of the resistor 27 is connected to the connection point between the diode 23 and the capacitor 24. An end of the resistor 28 is connected to the connection point between the diode 25 and the capacitor 26. The other end of each of the resistors 27 and 28 is connected to an end of a resistor 31. The resistors 27 and 28 make up the resistor adding circuit for adding a positive output value held at the positive peak hold circuit to a negative output value held at the negative peak hold circuit. A detection signal corresponding to the external magnetic field is present at an end of the resistor 31.

The other end of the resistor 31 is connected to the inverting input of an operational amplifier 32. The noninverting input of the operational amplifier 32 is grounded through a resistor 33. The output of the operational amplifier 32 is connected to the noninverting input through a resistor 34. The amplifier 32 and the resistors 31, 33 and 34 make up an inverting amplifier.

The output of the operational amplifier 32 is connected to an end of a resistor 35 for detecting an output. The other end of the resistor 35 is connected to the connection point between the coil 6 and the capacitor 7. The one end of the resistor 35 is connected to the noninverting input of an operational amplifier 38 through a resistor 37. The noninverting input of the amplifier 38 is grounded through a resistor 39. The output of the amplifier 38 is connected to the inverting input through a resistor 40 and to an detection output 41. The amplifier 38 and the resistors 36, 37, 39 and 40 make up a differential amplifier.

The detection coil 20, the coil 6 and the capacitor 7 are not only part of the oscillation circuit as the drive circuit 3 but also part of the detection and feedback circuit 5.

Specific examples of the components of the magnetic sensor apparatus shown in FIG. 9 will now be described. The magnetic core 1 is a rod-shaped core made of Ni—Cu—Zn-base ferrite having a diameter of 0.8 mm and a length of 2.5 mm. The sensor coil 2 is made of 250 turns of urethane-coated lead wire having a diameter of 0.03 mm wound around the core 1 stated above, for example. Inductance Ls of the sensor coil 2 is 500 µH. A coil current that reduces the inductance to one-half is 60 mA. The core 1 may be drum-shaped or have any other shape, in addition to the shape of a rod.

The detection coil 20 is an inductance element commercially available whose inductance Ld is 22 µH. The coil 6 as the feedback current path is an inductance element commercially available whose inductance Lf is 1 mH. The oscillation frequency of the oscillation circuit is basically determined by the parallel combined inductance of (Ls+Ld) and Lf, and capacitance Cs of the capacitor 12. When Cs equals to 2700 pF, the oscillation frequency is 165 kHz. Since sampling is made at two points of positive and negative for one cycle of excitation current in the magnetic sensor apparatus utilizing a fluxgate element, the sampling frequency is twice the excitation frequency. The Nyquist frequency that is the threshold response frequency is half the sampling frequency. Accordingly, the Nyquist frequency of the magnetic sensor apparatus is 165 kHz. However, it is possible to increase the oscillation frequency up to around 500 kHz as long as the withstand voltage of the sensor coil 2, the coil 6 and the capacitor 12 is carefully considered.

The amplitude of oscillation at the connection point between the sensor coil 2, the coil 6 and the capacitor 12 obtained by measurement is 70 $V_{p-p}$ when the operation voltage of the circuit is 5 V. Since the impedance of the inductance of (500+22) µH of the sensor coil 2 and the detection coil 20 is 541 ohm at 165 kHz, the sensor coil 2 is driven by an alternating current of 129 $mA_{p-p}$, that is, about +65 mA, and the core 1 is driven into the saturation region.

The operation of the magnetic sensor apparatus of the embodiment will now be described. An alternating current is supplied to the sensor coil 2 by the oscillation circuit as the drive circuit 3 such that the core 1 is driven into the saturation region. The alternating current is a resonant current that is equal to the current value limited by the supply voltage multiplied by value Q of the resonant circuit. A method taken in this embodiment is to detect variations in waveform of resonant current as a method of capturing variations in inductance of the sensor coil 2 as an output signal of the magnetic sensor apparatus. To be specific, the voltage across the detection coil 20 connected to the sensor coil 2 in series and having a large saturation current is differentiated at the differentiation circuit made up of the capacitor 21 and the resistor 22. A positive output value of an output of the differentiation circuit is held at the positive peak hold circuit made up of the diode 23 and the capacitor 24. A negative output value of the output of the differentiation circuit is held at the negative peak hold circuit made up of the diode 25 and the capacitor 26. The positive and negative output values are added to each other at the resistor adding circuit made up of the resistors 27 and 28. A detection signal corresponding to the external magnetic field is thus obtained.

In this embodiment the external magnetic field is measured from the sum of positive and negative peak values (the difference between the absolute values) of the differentiation waveform of the voltage waveform across the detection coil 20. The principle of measurement is described above with reference to FIG. 2A to FIG. 2F.

The detection and feedback circuit 5 detects the magnetic field to be measured, based on a portion of the resonant current passing through the sensor coil 2 that drives the core 1 into the saturation region. In other words, the detection and feedback circuit 5 detects the magnetic field to be measured, based on asymmetric positive and negative components of the resonant current passing through the sensor coil 2.

The detection signal obtained at the adding circuit made up of the resistors 27 and 28 is inverted and amplified at the inverting amplifier made up of the operational amplifier 32 and the resistors 31, 33 and 34. The signal is then carried through the resistor 35 and applied to the connection point between the coil 6 and the capacitor 7. A feedback current is thereby supplied to the sensor coil 2 through the coil 6 and magnetomotive force in the direction opposite to the external magnetic field is applied to the sensor coil 2. In this embodiment, since the inverting amplifier has outputs of both positive and negative polarities, negative and positive feedback currents (wherein one of the directions of the external field is defined as positive) corresponding to the positive and negative polarities of the external magnetic field are supplied from the output of the inverting amplifier to the sensor coil 2. Therefore, the end of the inverting amplifier on the side of the sensor coil 2 is grounded.

The external magnetic field is measured as follows. The feedback current, that is, the current corresponding to the external field, is converted to a voltage by the resistor 35. The voltage is amplified at the differential amplifier made up of the operational amplifier 38 and the resistors 35, 36, 39 and 40, and then given to the detection output 41. A detection output signal corresponding to the external field is then outputted from the detection output 41.

The balance between the external field and the magnetomotive force generated by the feedback current does not change unless the ampere turn of the sensor coil changes. Consequently, the magnetic sensor apparatus of the embodiment achieves reduced sensitivity variations, excellent linearity, and excellent stability against changes in temperature, supply voltage and so on. In addition, since the large amplitude excitation method is taken, the offset is zero, according to the principle, and no drift due to external perturbations occurs. The only remaining factor causing variations results from hysteresis of the magnetic core 1. However, the effect of hysteresis is negligible since the rod-shaped core 1 is used in the open magnetic circuit. The hysteresis obtained by actual measurement is 0.1 percent or less.

According to the embodiment thus described, a resonant current of the resonant circuit is supplied to the sensor coil 2. As a result, an alternating current that drives the core 1 into the saturation region is easily supplied to the sensor coil 2. In addition, the configuration of the apparatus is simple since it is not required to wind any coil for excitation around the core 1 besides the sensor coil 2.

According to the embodiment, the feedback current used for the negative feedback method is supplied to the sensor coil 2 through the coil 6 connected to the sensor coil 2 in parallel in terms of alternating current when seen from the series resonant circuit. As a result, the feedback current is easily supplied to the sensor coil 2 without causing a loss of resonant current.

According to the embodiment, a detection output of the order of volts is easily obtained by inserting the detection coil 20 to the resonant circuit, without reducing value Q of the resonant circuit, that is, without causing insufficiency in resonant current supplied to the sensor coil 2. In addition, the peak hold circuit is implemented by the simple and inexpensive one utilizing the diode and the capacitor. The detection coil 20 is able to obtain a sufficiently large output even when the inductance value thereof is less than ten percent of the inductance value of the sensor coil 2. Therefore, since the number of turns of the detection coil 20 is small and the saturation current value is sufficiently large in general, the detection coil 20 will not be saturated by the drive current (resonant current) of the sensor coil 2.

The features of the magnetic sensor apparatus of the embodiment are listed below.

(1) Since the negative feedback method is taken, sensitivity variations are reduced and thermal characteristics are improved automatically.

(2) Thus, no sensitivity adjustment or thermal characteristic compensation is required.

(3) No offset adjustment is required.

(4) The apparatus exhibits excellent properties since the large amplitude excitation method is applied.

(5) No special method is required for fabricating the sensor section.

(6) Since resonant current is utilized, the sensor coil is driven at a low supply voltage and a high frequency.

(7) No special material or method is required for fabricating the apparatus and the circuit is very simple. As a result, the apparatus is manufactured at an extremely low cost and it is possible to meet the great demand.

(8) The apparatus has an excellent frequency response.

(9) Power consumption is low since resonant current is used.

(10) The apparatus is small and light-weight since the configuration is simple.

As thus described, the magnetic sensor apparatus of the embodiment is very effective for application to an electric car or controlling direct current in solar-electric power generation.

Some modification examples of the embodiment will now be described.

Although the Clapp oscillation circuit is used as the oscillation circuit in the magnetic sensor apparatus shown in FIG. 9, a Colpitts oscillation circuit may be used if the saturation current value of the sensor coil 2 is small and the drive voltage may be low. The Colpitts oscillation circuit has a configuration similar to that of the circuit shown in FIG. 9 and is implemented where the relationship among capacitance Cs, Cb and Ce of the capacitors 12, 13 and 14 is Cb<<Cs and Ce<<Cs.

Figure 13:
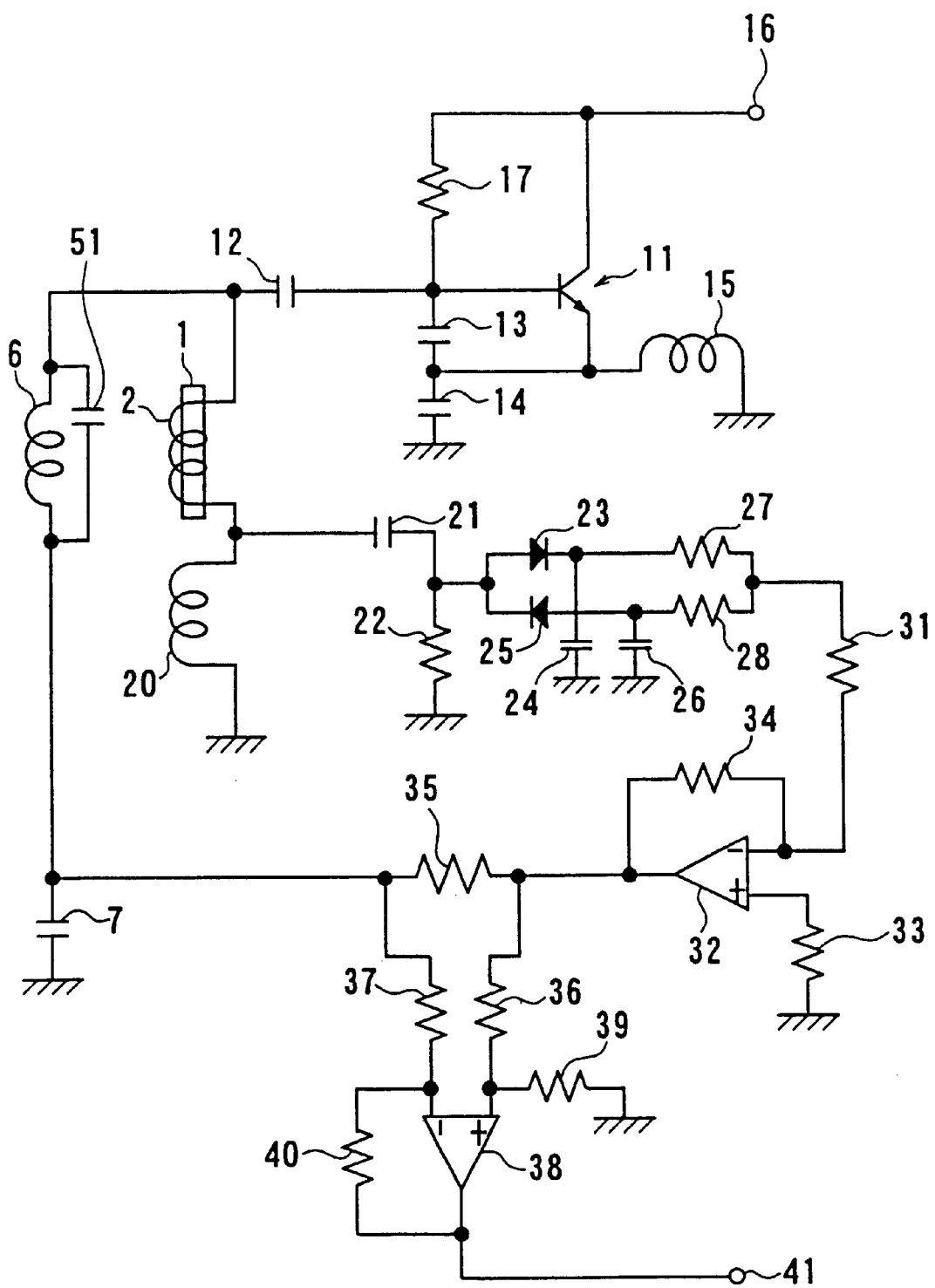
FIG. 13 is a circuit diagram illustrating the configuration of a modification example of the magnetic sensor apparatus of the third embodiment.

FIG. 13 is a circuit diagram of a magnetic sensor apparatus of a modification example of the embodiment. This apparatus is similar to the apparatus shown in FIG. 9 except that a capacitor 51 is connected to the coil 6 in parallel. The parallel resonant frequency of the capacitor 51 and the coil 6 is set to a value nearly equal to the resonant frequency of the series resonant circuit defined by the sensor coil 2 and the capacitor 12 for resonance and so on (that is, the oscillation frequency of the oscillation circuit). This configuration allows the current passing through the coil 6 to be reduced.

Fourth Embodiment

Figure 14:
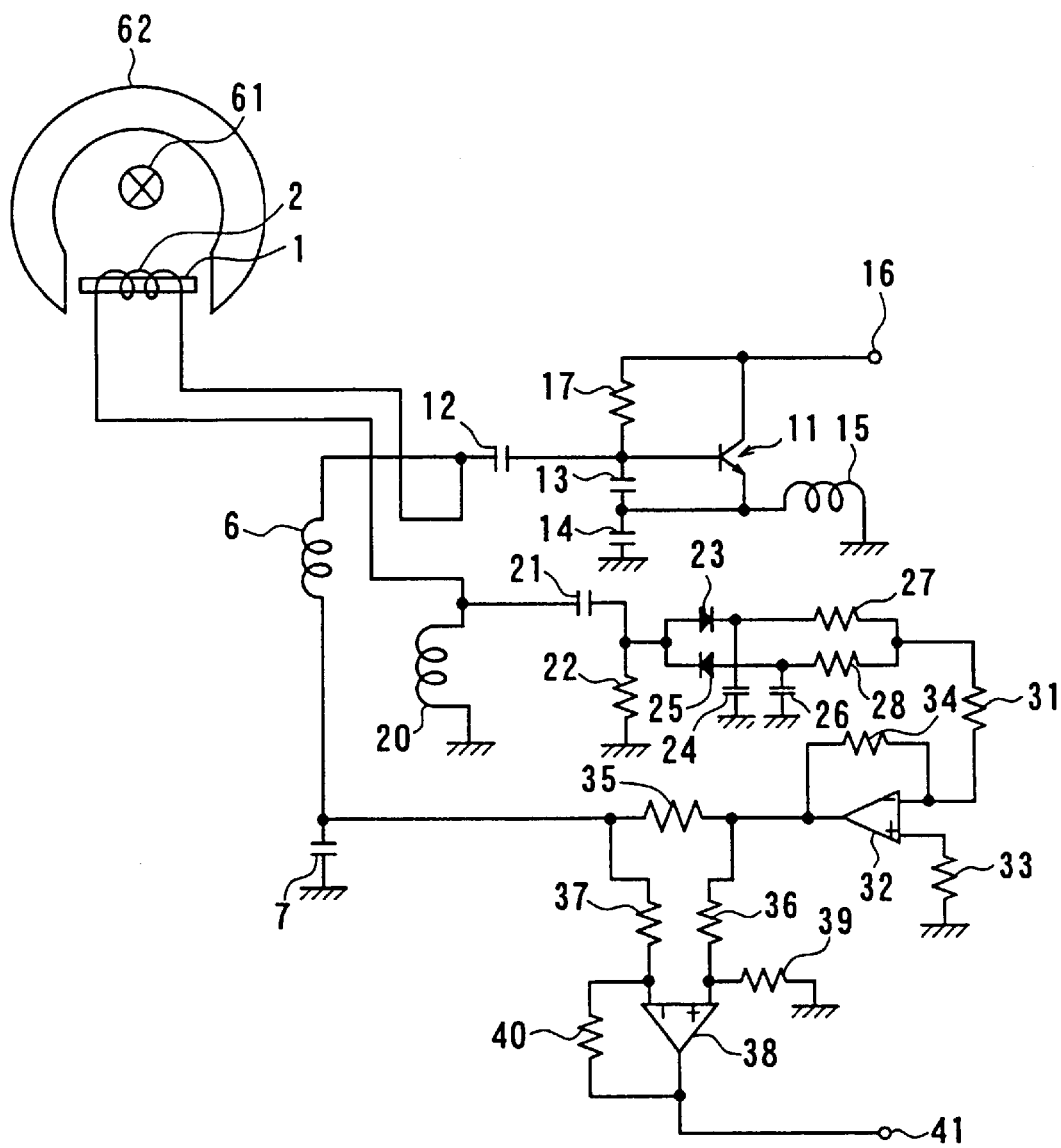
FIG. 14 is a circuit diagram illustrating the configuration of a current sensor apparatus of the fourth embodiment.

A current sensor apparatus of the fourth embodiment of the invention will now be described. FIG. 14 is a circuit diagram of the current sensor apparatus. The current sensor apparatus incorporates the magnetic sensor apparatus of the third embodiment.

The current sensor apparatus comprises the magnetic yoke 62 that surrounds the conductor 61 through which a current to be measured passes. Part of the yoke 62 has a gap. In the gap of the yoke 62, the core 1 and the sensor coil 2 of the magnetic sensor apparatus of the third embodiment are placed. The remainder of the configuration of the current sensor apparatus of the fourth embodiment is similar to that of the magnetic sensor apparatus of the third embodiment.

A specific example of the current sensor apparatus actually fabricated will now be described. In this example, the yoke 62 is a toroidal core made of Mn—Zn-base ferrite. The yoke 62 has an outer diameter of 20 mm, an inner diameter of 10 mm and a thickness of 5 mm and has a gap of 8 mm in width. In this example the dimensions of the entire apparatus are 20 mm by 35 mm by 6 mm and very small. The apparatus is operated at a power source of ±5 V. Current consumption is +25 mA and −2 mA when the current to be measured is zero. In the apparatus an increase in current consumption due to a feedback current is 10 mA per current to be measured of 10 A. The weight of the apparatus is 10 g.

Figure 15:
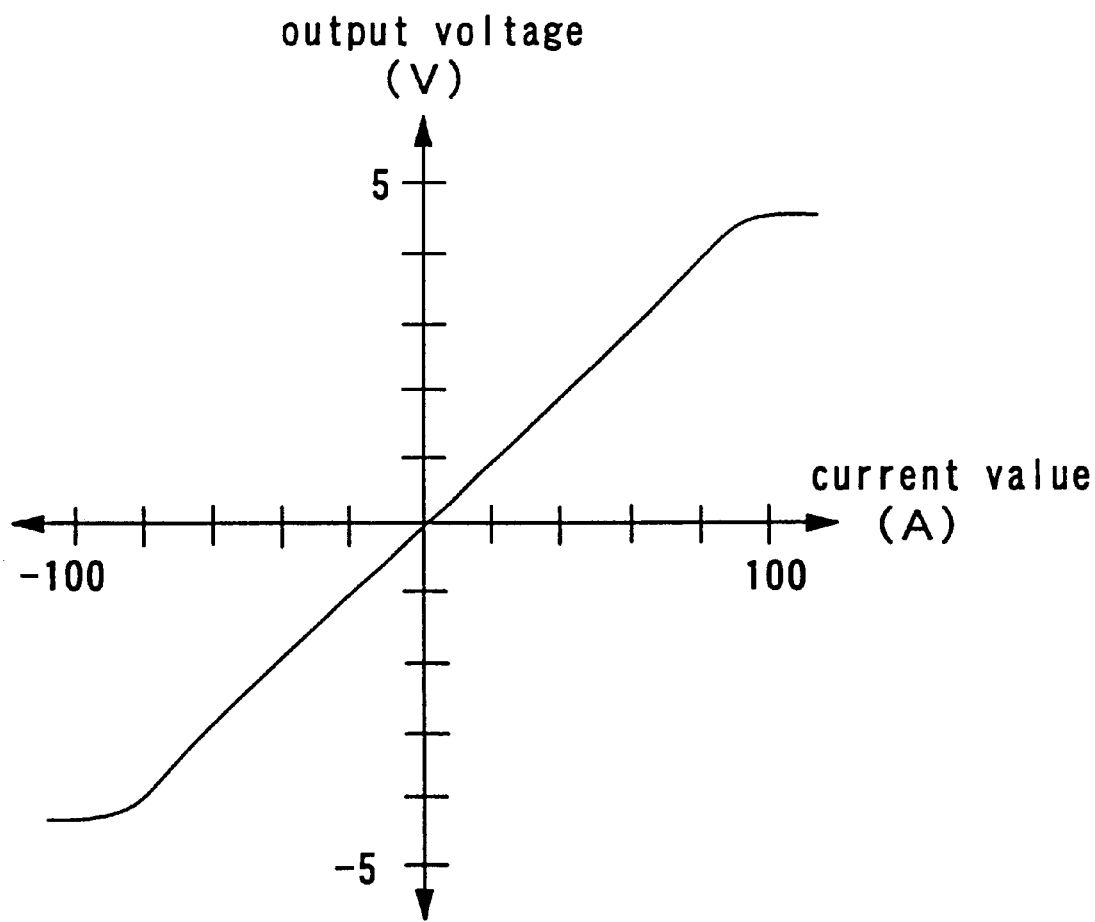
FIG. 15 is a plot illustrating an example of a characteristic of the current sensor apparatus of the fourth embodiment.

FIG. 15 shows an example of the relationship between an output voltage of the current sensor apparatus of the embodiment and a current to be measured passing through the conductor 61 placed inside the magnetic yoke 62 of the sensor apparatus. As shown, a linear output voltage characteristic is obtained in a good condition in a wide current range, according to the current sensor apparatus. The range of current to be measured may be increased to the limit placed by the restriction of the circuit of the operational amplifier and so on, according to the principle. The apparatus is therefore highly effective for application to an electric car or controlling direct current in solar-electric power generation.

The remainder of function and effects of the embodiment are similar to those of the third embodiment.

In the present invention the second current supplied to the sensor coil 2 is not limited to feedback current used for the negative feedback method but may be bias current and the like.

The configurations of the drive circuit 3 and the detection and feedback circuit 5 of the third and fourth embodiments are given as examples and may be practiced in still other ways through the use of known techniques.

According to the magnetic sensor apparatus of the invention including the third embodiment or the current sensor apparatus of the invention including the fourth embodiment, the oscillation circuit including the series resonant circuit supplies a resonant current flowing through the series resonant circuit to the sensor coil. The current supply means supplies the second current including a direct current, that is, a current having no frequency, to the sensor coil. The second current has a frequency other than the resonant frequency of the series resonant circuit (the oscillation frequency of the oscillation circuit). As a result, the negative feedback method is easily applied and it is possible to provide the magnetic sensor apparatus or the current sensor apparatus that is inexpensive and has excellent properties.

The current supply means may include the second coil forming part of the series resonant circuit and connected to the sensor coil in parallel in terms of alternating current when seen from the series resonant circuit. The second current may be supplied to the sensor coil through the second coil. As a result, the second current is easily supplied to the sensor coil without causing a loss of resonant current.

If the inductance of the second coil is equal to or greater than the inductance of the sensor coil, power consumption is further reduced.

The current supply means may further include the capacitor connected to the second coil in parallel, and the parallel resonant frequency of the capacitor element and the second coil may be set to a value nearly equal to the resonant frequency of the series resonant circuit (the oscillation frequency of the oscillation circuit). As a result, the current passing through the second coil is further reduced.

The apparatus may further comprise the detection means for detecting a magnetic field to be measured, based on the resonant current passing through the sensor coil, and the detection means may include the inductance element inserted to the series resonant circuit and the differentiation circuit for differentiating the voltage across the inductance element and outputting a signal corresponding to the magnetic field to be measured. In this case, it is possible to detect the magnetic field without causing insufficiency in resonant current supplied to the sensor coil.

The current supply means may supply the second current such that the resonant current passing through the sensor coil constantly has symmetric positive and negative portions. As a result, it is further possible to reduce sensitivity variations and improve thermal characteristics.

Fifth Embodiment

A fifth embodiment of the invention will now be described. First, a summary of the embodiment will be described.

As described above, the effect of external perturbations on the fluxgate element are caused by variations in inductance of the sensor coil at positive and negative peaks of excitation current. It is possible to make the most of 'excellent stability against external perturbations' which is the feature of the large amplitude excitation method and the negative feedback method, if variations in inductance of the sensor coil due to external perturbations would not cause variations in offset error which is a measurement error of the sensor apparatus resulting from asymmetry between positive and negative peak values of excitation current when the external magnetic field is zero, that is, if the magnitude of the offset error is constant regardless of external perturbations.

In this embodiment, the value of the offset error is maintained constant, regardless of external perturbations, while the offset error is accepted.

As mentioned above, in the case of the large amplitude excitation method, if the offset error is present, a difference in amounts of inductance variations of the sensor coil at positive and negative peaks of excitation current causes the offset error when the external field is zero. This offset error is constant if no external perturbations exist.

If the negative feedback method is applied together with the large amplitude excitation method, the sensor coil constantly operates in a cancellation magnetic field corresponding to the offset error even if an external magnetic field is present. Consequently, if both of the large amplitude excitation method and the negative feedback method are used, the offset error resulting from the difference in amounts of inductance variations of the sensor coil at positive and negative peaks of excitation current is constant, regardless of the presence of an external magnetic field when no external perturbations exist.

When both of the large amplitude excitation method and the negative feedback method are used, a measurement signal (that corresponds to the cancellation magnetic field) of the sensor apparatus for detecting the external magnetic field is independent of the magnitudes of amounts of inductance variations themselves. This is because the measurement signal results from the difference in amounts of inductance variations of the sensor coil at positive and negative peaks of excitation current. In contrast, the offset error changes in proportion to the difference in amounts of inductance variations of the sensor coil at positive and negative peaks of excitation current. This fact indicates that, if control is performed to maintain the magnitude of amounts of inductance variations of the sensor coil at the positive and negative peaks of excitation current, the offset error is maintained constant without affecting a measurement signal of the sensor apparatus for detecting the external field.

That is, the offset error is maintained constant without being affected by external perturbations by performing control to maintain the magnitude of amounts of inductance variations themselves of the sensor coil at the positive and negative peaks of excitation current. This control may be implemented by detecting amounts of inductance variations of the sensor coil at the positive and negative peaks of excitation current from the excitation current supplied to the sensor coil, and controlling the excitation drive circuit is controlled such that the amounts of inductance variations maintained constant.

Figure 16:
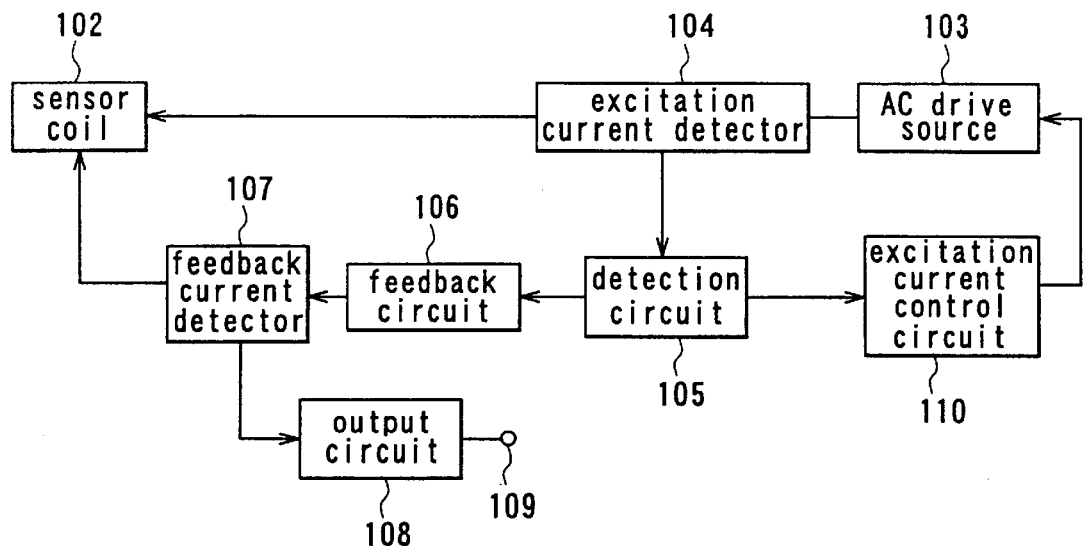
FIG. 16 is a schematic block diagram illustrating the configuration of a current sensor apparatus of a fifth embodiment.
Figure 17:
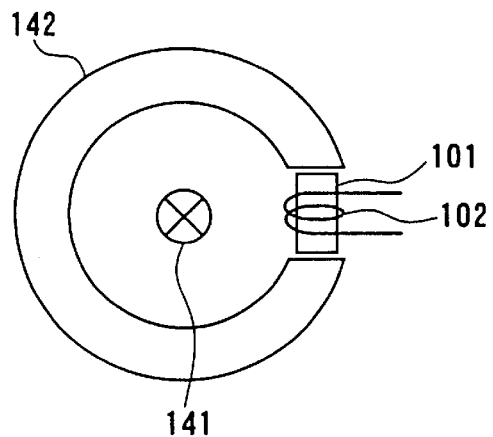
FIG. 17 is an explanatory view illustrating a neighborhood of the sensor coil of FIG. 16.

The fluxgate magnetic sensor apparatus and the fluxgate current sensor apparatus of the fifth embodiment of the invention will now be described. FIG. 16 is a schematic block diagram of the current sensor apparatus of the embodiment. The current sensor apparatus incorporates the magnetic sensor apparatus of the embodiment. FIG. 17 is an explanatory view showing the neighborhood of the sensor coil of FIG. 16. Both of the large amplitude excitation method and the negative feedback method are applied in the magnetic sensor apparatus and the current sensor apparatus of the embodiment.

As shown in FIG. 17, the current sensor apparatus comprises: a sensor magnetic core 101 having a magnetic saturation property; and a sensor coil 102 wound around the core 101. The apparatus further comprises a magnetic yoke 142 that surrounds a conductor 141 through which a current to be measured passes in the direction orthogonal to the drawing sheet. Part of the yoke 142 has a gap in which the core 101 and the sensor coil 102 are placed.

As shown in FIG. 16, the current sensor apparatus further comprises: an alternating current drive source 103 for driving the coil 102 by supplying an excitation current, that is, an alternating drive current that drives the core 101 into a saturation region, to the coil 102; an excitation current detector 104 for detecting the excitation current supplied to the coil 102 by the drive source 102; and a detection circuit 105 for generating and outputting a signal corresponding to the magnetic field to be measured, based on the detection output of the detector 104 and for generating and outputting a signal corresponding to the amounts of inductance variations in the saturation region of the core 101, based on the detection output of the detector 104.

The current sensor apparatus further comprises: a feedback circuit 106 for amplifying a signal corresponding to the magnetic field to be measured outputted from the detection circuit 105 and generating and outputting a negative feedback current; a feedback current detector 107 for detecting the negative feedback current outputted from the feedback circuit 106; and an output circuit 108 for generating a measurement signal corresponding to the field to be measured, based on the detection output of the detector 107, and outputting the measurement signal from an output 109. The negative feedback current outputted from the feedback circuit 106 is supplied to the coil 102 through the feedback current detector 107.

The current sensor apparatus further comprises an excitation current control circuit 110 for controlling the alternating current drive source 103 to control the excitation current, based on the signal corresponding to the amounts of inductance variations outputted from the detection circuit 105.

Power is supplied from a power source not shown to the drive source 103 and part of the other circuits shown in FIG. 16.

The alternating current drive source 103 corresponds to a drive means of the invention. The excitation current detector 104, the detection circuit 105, the feedback circuit 106, the feedback current detector 107 and the output circuit 108 correspond to a field detection means of the invention and detect a magnetic field to be measured by detecting variations in inductance of the coil 102. The feedback circuit 106 corresponds to a negative feedback current supply means of the invention. The excitation current detector 104 and the detection circuit 105 correspond to an inductance variation amount detection means of the invention and detect the amounts of inductance variations in the saturation region of the core 101 in an equivalent manner. The excitation current control circuit 110 corresponds to a control means of the invention.

The current sensor apparatus shown in FIG. 16 and FIG. 17 except the yoke 142 is the magnetic sensor apparatus of the embodiment.

The operation of the magnetic sensor apparatus and the current sensor apparatus shown in FIG. 16 and FIG. 17 will now be described. In the current sensor apparatus, a magnetic field to be measured is generated by a current to be measured passing through the conductor 141 in the direction orthogonal to the drawing sheet. The field to be measured is applied to the coil 102 through the yoke 142.

In the current sensor apparatus, the drive source 103 supplies an excitation current that drives the core 101 into the saturation region to the coil 102. The excitation current detector 104 detects the excitation current. Based on the detection output of the detector 104, the detection circuit 105 generates a signal corresponding to the field to be measured and outputs the signal to the feedback circuit 106. In addition, the detection circuit 105 generates a signal corresponding to the amounts of inductance variations in the saturation region of the core 101 and outputs the signal to the excitation current control circuit 110. The excitation current detector 104 detects, for example, positive and negative peak values of the excitation current. The detection circuit 105 generates a signal corresponding to the difference in absolute values of the positive and negative peak values of the excitation current as a signal corresponding to the field to be measured. In addition, the detection circuit 105 generates a signal corresponding to the peak values of the excitation current as a signal corresponding to the amounts of inductance variations in the saturation region. If the core 101 is driven into the saturation region, the excitation current abruptly increases. Accordingly, the amounts of inductance variations of the core 101 in the saturation region are detected.

The signal outputted from the detection circuit 105 and corresponding to the field to be measured is amplified at the feedback circuit 106 to be a negative feedback current. The negative feedback current is supplied to the coil 102 through the feedback current detector 107. The negative feedback current generates a cancellation magnetic field that cancels the external field.

The feedback current detector 107 detects the negative feedback current. Based on the detection output of the detector 107, the output circuit 108 generates a measurement signal corresponding to the magnetic field to be measured and outputs the signal from the output 109.

The excitation current control circuit 110 controls the alternating current drive source 103 to control the excitation current, based on the signal corresponding to the amounts of inductance variations in the saturation region and outputted from the detection circuit 105. The control circuit 110 controls the drive source 103 such that the amounts of inductance variations are kept constant, that is, the peak values of the excitation current are kept constant, to be specific.

Reference is now made to FIG. 18 to FIG. 24 to describe a specific example of circuit configuration of components of FIG. 16.

Figure 18:
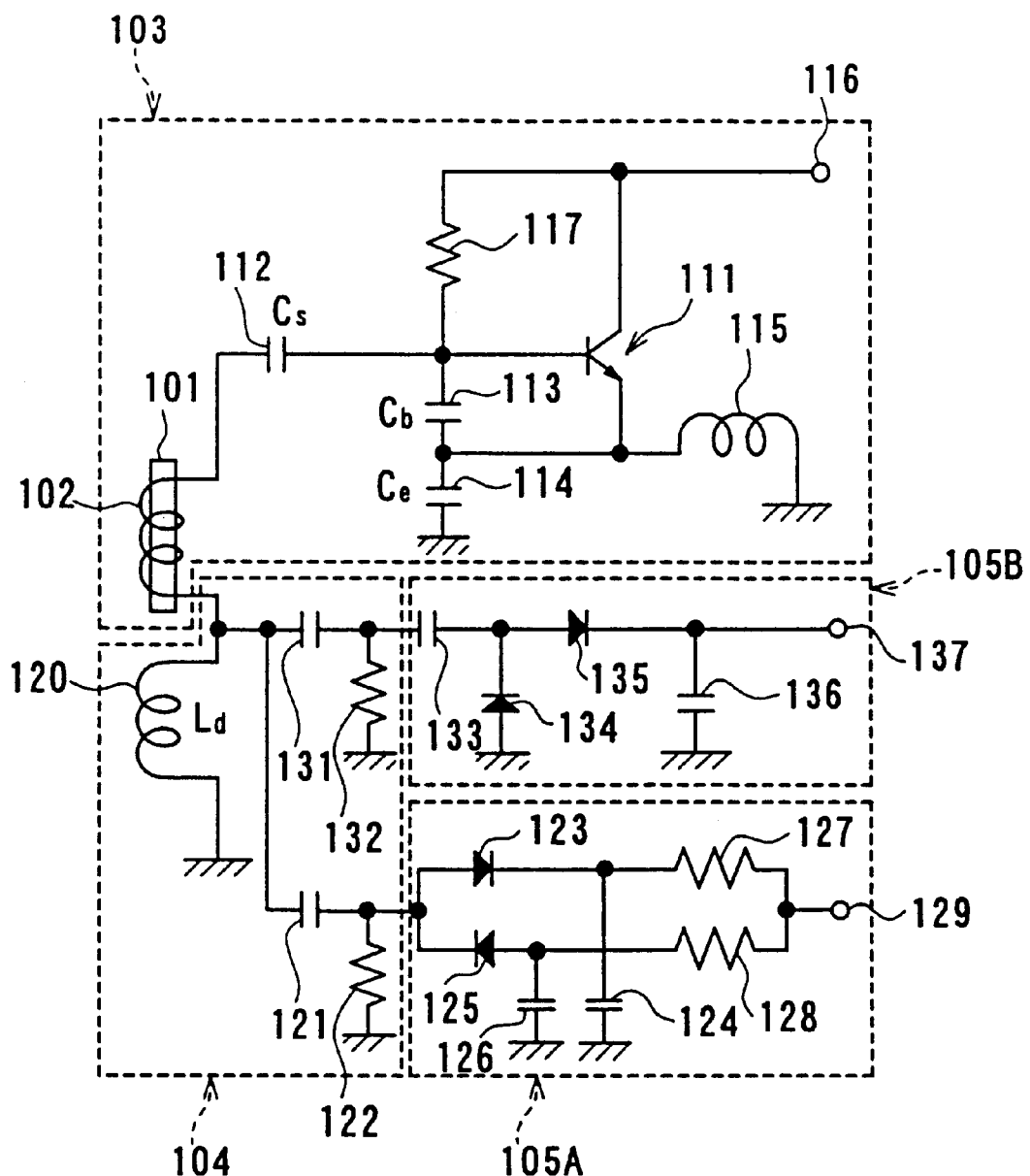
FIG. 18 is a circuit diagram illustrating an example of the configuration of the alternating current drive source, current detector and detection circuit of FIG. 16.

FIG. 18 is a circuit diagram illustrating an example of configuration of the alternating current drive source 103, the excitation current detector 104, and the detection circuit 105. In this example the drive source 103 has a self-excited oscillation circuit whose circuit that determines oscillation time constant incorporates the coil 102. The self-excited oscillation circuit has a series resonant circuit incorporating the coil 102 and supplies a resonant current passing through the series resonant circuit to the coil 102. The resonant current is an excitation current that drives the core 101 into the saturation region. To be specific, the drive source 103 has a configuration as follows. That is, the drive source 103 has a NPN-type transistor 111. The base of the transistor 111 is connected to an end of the coil 102 through a capacitor 112 for resonance. An end of a capacitor 113 for feedback is connected to the base of the transistor 111. An end of a capacitor 114 for feedback and the emitter of the transistor 111 are connected to the other end of the capacitor 113. The other end of the capacitor 114 is grounded. The emitter of the transistor 111 is grounded through a choke coil 115 for cutting off high frequency. The collector of the transistor 111 is connected to a power input 116 and to the base through a bias resistor 117.

The alternating current drive source 103 shown in FIG. 18 has the configuration of a Clapp oscillation circuit. The relation of Cs<<Cb and Cs<<Ce is held where the capacitance of each of the capacitors 112, 113 and 114 is Cs, Cb and Ce, respectively.

In the drive source 103 shown in FIG. 18, the excitation current is equal to the value of the current limited by the supply voltage multiplied by value Q of the series resonant circuit incorporating the coil 102. Since value Q is 10 or greater, an excitation current sufficiently large is supplied to the coil 102.

Instead of the Clapp oscillation circuit, a Colpitts oscillation circuit may be used if the saturation current value of the coil 102 is small and the drive voltage may be low. The Colpitts oscillation circuit has a configuration similar to that of the circuit shown in FIG. 18 and is implemented where the relationship among capacitance Cs, Cb and Ce of the capacitors 112, 113 and 114 is Cb<<Cs and Ce<<Cs. However, in the Colpitts circuit, the capacitor 112 is not used for resonance but used for cutting off direct current.

The excitation current detector 104 of the example shown in FIG. 18 has a configuration as follows. That is, the detector 104 has a detection coil 120 an end of which is connected to the other end of the coil 102. The other end of the detection coil 120 is grounded. An end of a capacitor 121 is connected to the connection point between the coil 102 and the detection coil 120. The other end of the capacitor 121 is grounded through a resistor 122. The capacitor 121 and the resistor 122 make up a differentiation circuit for differentiating the voltage across the detection coil 120. An end of a capacitor 131 is connected to the connection point between the coil 102 and the detection coil 120. The other end of the capacitor 131 is grounded through a resistor 132. The capacitor 131 and the resistor 132 make up a differentiation circuit for differentiating the voltage across the detection coil 120.

In the example shown in FIG. 18, the detection circuit 105 has a detection circuit 105A for generating a signal corresponding to a magnetic field to be measured and a detection circuit 105B for generating a signal corresponding to the amounts of inductance variations in the saturation region of the core 101.

The detection circuit 105A has a configuration as follows. The anode of a diode 123 and the cathode of a diode 125 are connected to the connection point between the capacitor 121 and the resistor 122. The cathode of the diode 123 is grounded through a capacitor 124. The anode of the diode 125 is grounded though a capacitor 126. The diode 123 and the capacitor 124 make up a positive peak hold circuit. The diode 125 and the capacitor 126 make up a negative peak hold circuit. An end of a resistor 127 is connected to the connection point between the diode 123 and the capacitor 124. An end of a resistor 128 is connected to the connection point between the diode 125 and the capacitor 126. The other end of each of the resistors 127 and 128 is connected to an output 129 for outputting a signal corresponding to a magnetic field to be measured. The resistors 127 and 128 make up a resistor adding circuit for adding a positive output value held at the positive peak hold circuit to a negative output value held at the negative peak hold circuit.

The detection circuit 105B has a configuration as follows. The cathode of a diode 134 and the anode of a diode 135 are connected to the connection point between a capacitor 131 and a resistor 132 through a capacitor 133. The anode of the diode 134 is grounded. The cathode of the diode 135 is grounded through a hold capacitor 136. A control signal output 137 is connected to the connection point between the diode 135 and the capacitor 136. Through the output 137, a control signal corresponding to the amounts of inductance variations in the saturation region of the core 101 is outputted. The capacitor 133, the diodes 134 and 135 and the hold capacitor 136 make up a voltage multiplying rectifier circuit.

The operation of the circuit shown in FIG. 18 will now be described. The alternating current supply source 103 supplies an excitation current to the coil 102. The excitation current supplied drives the core 101 into the saturation region. A method taken in the example shown in FIG. 18 is to detect variations in waveform of the excitation current as a method of capturing variations in inductance of the coil 102 as an output signal of the current sensor apparatus. To be specific, the voltage across the detection coil 120 connected to the coil 102 in series and having a large saturation current is differentiated at the differentiation circuit made up of the capacitor 121 and the resistor 122. A positive output value of an output of the differentiation circuit is held at the positive peak hold circuit made up of the diode 123 and the capacitor 124. A negative output value of the output of the differentiation circuit is held at the negative peak hold circuit made up of the diode 125 and the capacitor 126. The positive and negative output values are added to each other at the resistor adding circuit made up of the resistors 127 and 128. A detection signal corresponding to the external magnetic field is thus obtained.

If no offset error is present, the positive and negative portions of the differential waveform of the voltage across the detection coil 120 are symmetric with respect to each other, and the sum of positive and negative peak values (the difference between the absolute values) of the differential waveform is zero when no external magnetic field is present. In contrast, when an external magnetic field is applied to the coil 102, the positive and negative portions of the differential waveform are asymmetric with respect to each other. As a result, the sum of the positive and negative peak values (the difference between the absolute values) of the differential waveform is other than zero, which depends on the external field. In this manner, the external field is measured by the sum of positive and negative peak values (the difference between the absolute values) of the differential waveform, according to this embodiment.

In the circuit shown in FIG. 18, a signal corresponding to the amounts of inductance variations in the saturation region of the core 101 is generated as follows. If the coil 102 is saturated near positive and negative peaks of the excitation current, the inductance of the coil 102 abruptly decreases, so that the current abruptly increases. Since the resonant frequency increases as the inductance decreases, the time span of part of the current waveform in which the current abruptly increases is short. The part of the current waveform in which the current abruptly increases is sine-wave-shaped. Therefore, if the wave of the excitation current is differentiated twice, a waveform geometrically similar to the original waveform whose phase is the reversal of the original waveform is obtained for part of the excitation current in which the current abruptly increases. In the circuit shown in FIG. 18, the wave of the excitation current is differentiated at the detection coil 120 (the voltage across the coil 120 is Ld di/dt where the inductance of the coil 120 is Ld). Furthermore, the wave is differentiated at the differentiation circuit made up of the capacitor 131 and the resistor 132. As a result, a waveform geometrically similar to the original waveform whose phase is the reversal of the original waveform is obtained in the output signal of the differentiation circuit for part of the excitation current in which the current abruptly increases. For part of the excitation current that does not drive the core 101 into the saturation region, the frequency components of the wave of this part are lower, compared to the part in which the current abruptly increases as the core 101 reaches the saturation region. Therefore, this part of the excitation current attenuates due to the low-frequency attenuation characteristic of the differentiation circuit, and the output signal level of the differentiation circuit is reduced. As a result, the waveform of the output signal of the differentiation circuit made up of the capacitor 131 and the resistor 132 is a spike-shaped voltage waveform projecting in both positive and negative directions. This waveform corresponds to the inductance of the coil 102 in the saturation region of the core 101.

In such a manner, the detection output of the portion of the excitation current in which the current abruptly increases that corresponds to the variation in inductance of the coil 102 is obtained at the differentiation circuit made up of the capacitor 131 and the resistor 132. This detection output is rectified at the voltage multiplying rectifier circuit made up of the capacitor 133, the diodes 134 and 135, and the hold capacitor 136. The amplitude thereof is detected. The output signal of the voltage multiplying rectifier circuit is outputted from the control signal output 137 as a control signal for controlling the excitation current.

Figure 19:
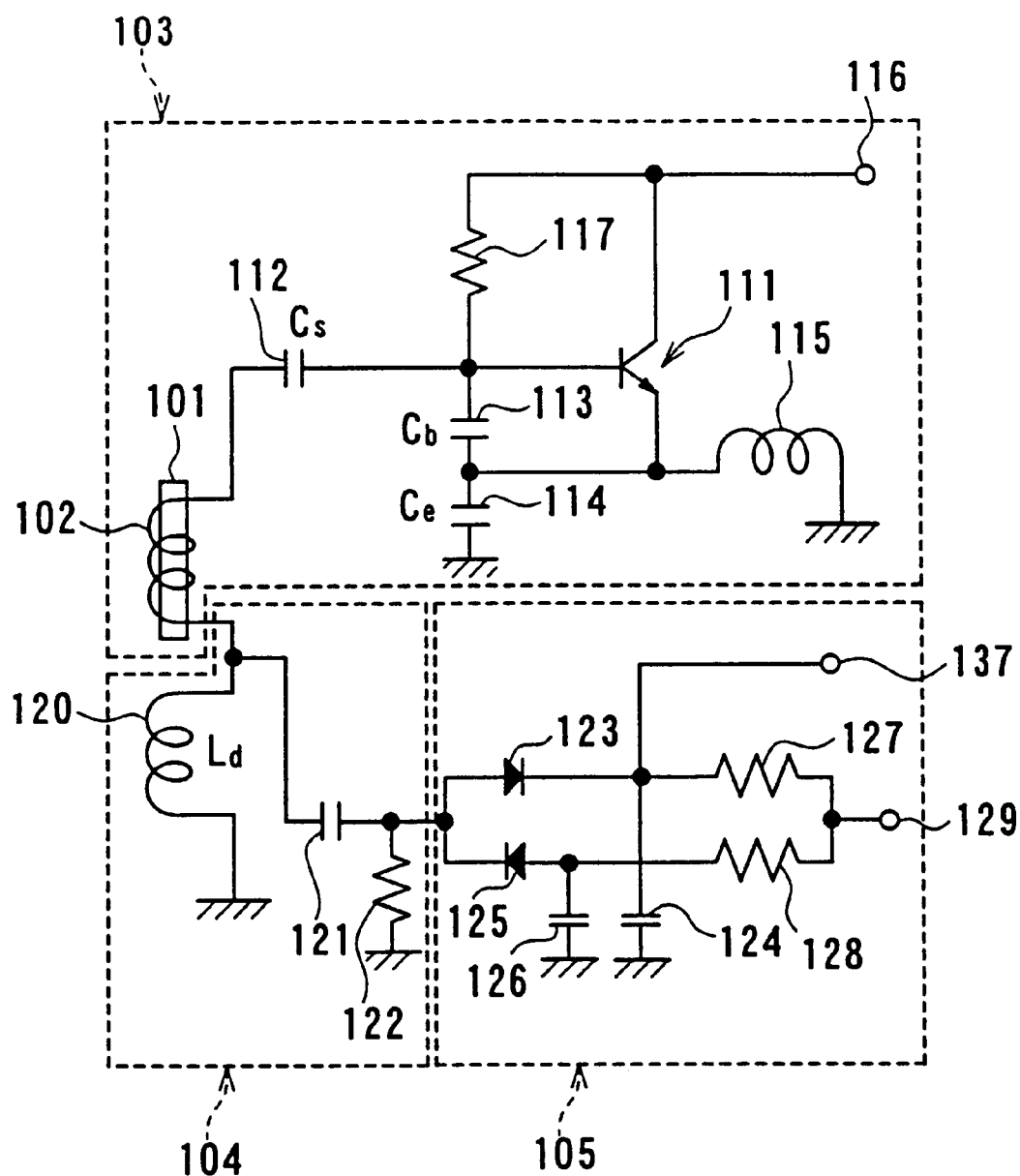
FIG. 19 is a circuit diagram illustrating another example of the configuration of the alternating current drive source, current detector and detection circuit of FIG. 16.

FIG. 19 is a circuit diagram illustrating another example of configuration of the alternating current drive source 103, the excitation current detector 104, and the detection circuit 105. In this example the excitation current detector 104 includes the detection coil 120, the capacitor 121 and the resistor 122 that are similar to those of the example shown in FIG. 18, but does not include the capacitor 131 and the resistor 132. In the example shown in FIG. 19, the detection circuit 105 includes the diodes 123 and 125, the capacitors 124 and 126, the resistors 127 and 128, and the output 129 that are similar to those of the example shown in FIG. 18, but does not include the capacitor 133, the diodes 134 and 135, and the capacitor 136. In the example shown in FIG. 19, the control signal output 137 for outputting a signal for controlling the excitation current is connected to the connection point between the diode 123 and the capacitor 124.

As thus described, in the example shown in FIG. 19, the voltage held at the positive peak hold circuit made up of the diode 123 and the capacitor 124 is utilized as a signal for controlling the excitation current. The reason that this is possible is as follows.

When the negative feedback method is applied, an offset error results from the difference in absolute values of positive and negative peaks of the output signal of the detector 104 if the amount of feedback is sufficiently large. Regardless of the presence of an external magnetic field, the offset error is kept constant if no external perturbations exist. In this embodiment, variations in output signal of the detector 104 due to external perturbations are eliminated. As a result, the positive and negative peaks of the output signal of the detector 104 will not be changed by the external field or external perturbations. Therefore, there is no problem in using an output of either the positive peak hold circuit made up of the diode 123 and the capacitor 124 or the negative peak hold circuit made up of the diode 125 and the capacitor 126 as a control signal.

The remainder of configuration and operation of the example shown in FIG. 19 are similar to those of the example shown in FIG. 18.

In this embodiment, the excitation current control circuit 110 controls the alternating current drive source 103 such that the peak values of the excitation current are kept constant. The following methods may be taken, for example, to control the drive source 103 in such a manner.

(1) Control the operation voltage of the oscillation circuit.
(2) Control the base bias current of the oscillation circuit.
(3) Control the emitter potential of the oscillation circuit.
(4) Control the emitter current of the oscillation circuit.

Controlling the emitter potential is equivalent to controlling the operation voltage. Controlling the emitter current is equivalent to controlling the base bias current. Therefore, the methods of controlling the drive source 103 may be categorized into two methods of controlling the operation voltage of the oscillation circuit in an equivalent manner and controlling the base bias current of the oscillation circuit in an equivalent manner. Although the base bias current inevitably changes if the operation voltage changes, the methods of controlling the drive source 103 are divided into the above two methods, attention being given to the subject of control. Controlling the base bias current is equivalent to controlling the operation point of the oscillation circuit.

To control the operation voltage of the oscillation circuit, a method of inserting a control circuit to the power-source side of the oscillation circuit or a method of inserting a control circuit to the emitter side of the oscillation circuit may be taken, for example. To control the base bias current of the oscillation circuit, a method of controlling the base bias voltage of the oscillation circuit or a method of inserting a field-effect transistor (FET) to the emitter circuit of the oscillation circuit and controlling the equivalent emitter resistor actively may be taken, for example. In addition to those methods, a method of directly controlling the base current by a variable constant current circuit may be taken if it is acceptable that the circuit is complicated. Regardless of the type of circuit configuration, this embodiment includes a magnetic sensor apparatus or a current sensor apparatus having a means for detecting the amounts of inductance variations themselves of the coil 102 at positive and negative peaks of the excitation current and controlling the excitation current such that the amounts of inductance variations are kept constant.

FIG. 20 to FIG. 23 illustrate first to fourth examples of the configuration of the excitation current control circuit 110, respectively.

Figure 20:
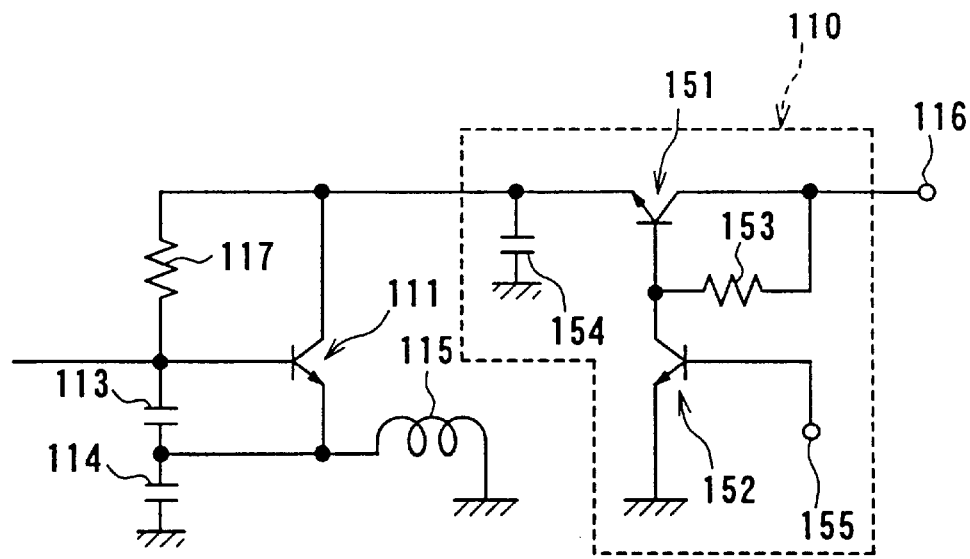
FIG. 20 is a circuit diagram illustrating a first example of the configuration of the excitation current control circuit of FIG. 16.

The first example shown in FIG. 20 is an example of the method of inserting a control circuit to the power-source side of the oscillation circuit and directly controlling the operation voltage of the oscillation circuit. The excitation current control circuit 110 of the first example includes NPN transistors 151 and 152. The collector of the transistor 151 is connected to the power input 116. The emitter of the transistor 151 is connected to the collector of the transistor 111 of the oscillation circuit and grounded through a decoupling capacitor 154. The base of the transistor 151 is connected to the power input 116 through a load resistor 153. The collector of the transistor 152 is connected to the base of the transistor 151. The emitter of the transistor 152 is grounded. The base of the transistor 152 is connected to a control signal input 155. The input 155 is connected to the control signal output 137 shown in FIG. 18 or FIG. 19.

In the control circuit 110 of the first example, a voltage controlled by the transistor 151 is supplied through the emitter of the transistor 151 to the oscillation circuit. Processing such as amplification or phase adjustment is performed on a control signal outputted from the output 137, if necessary, and the signal is inputted to the base of the transistor 152. If the control signal is increased due to external perturbations, the base current of the transistor 152 is increased and the collector potential is reduced. Accordingly, the emitter potential of the transistor 151, that is, the operation voltage of the oscillation circuit is lowered. As a result, the excitation current is reduced and the control signal is reduced. On the contrary, if the control signal is reduced due to external perturbations, the excitation current is increased and the control signal is increased. In such a manner, the excitation current is controlled such that the amounts of inductance variations of the coil 102 at positive and negative peaks of the excitation current are kept constant. The effect of external perturbations is thereby eliminated.

Figure 21:
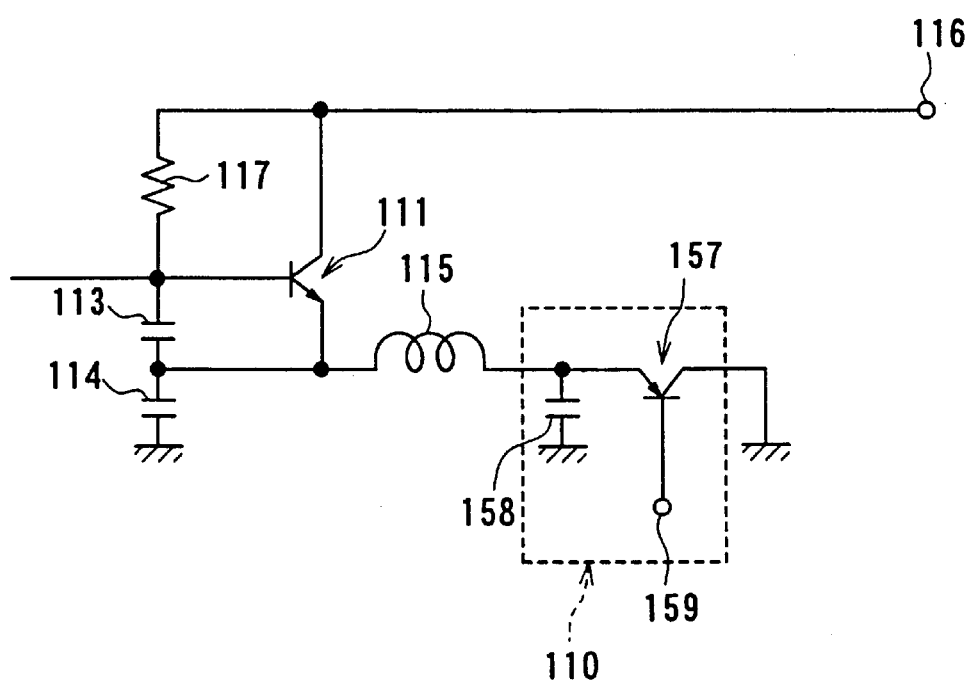
FIG. 21 is a circuit diagram illustrating a second example of the configuration of the excitation current control circuit of FIG. 16.

The second example shown in FIG. 21 is an example of the method of inserting a control circuit to the emitter side of the oscillation circuit and controlling the operation voltage of the oscillation circuit. The excitation current control circuit 110 of the second example includes a PNP transistor 157. The emitter of the transistor 157 is connected to the emitter of the transistor 111 of the oscillation circuit through the choke coil 115 for cutting off high frequency. The connection point between the emitter of the transistor 157 and the coil 115 is grounded in terms of alternating current through a large capacitance capacitor 158. The collector of the transistor 157 is grounded. The base of the transistor 157 is connected to a control signal input 159. The input 159 is connected to the control signal output 137 shown in FIG. 18 or FIG. 19.

In the control circuit 110 of the second example, the transistor 157 functions as an emitter follower circuit.

Therefore, if the control signal is increased due to external perturbations, the emitter potential and the base potential of the transistor 157 are equally increased and the potential between the collector and the emitter, that is, the operation voltage is reduced. As a result, the excitation current is reduced and the control signal is reduced. On the contrary, if the control signal is reduced due to external perturbations, the excitation current is increased and the control signal is increased. In such a manner, the effect of external perturbations is eliminated as in the first example.

If necessary, processing such as amplification or phase adjustment may be performed on the control signal, or processing such as biasing for compensating a drop in the base-emitter potential of the transistor 157 may be performed. An operation amplifier may be used in place of the transistor 157.

Figure 22:
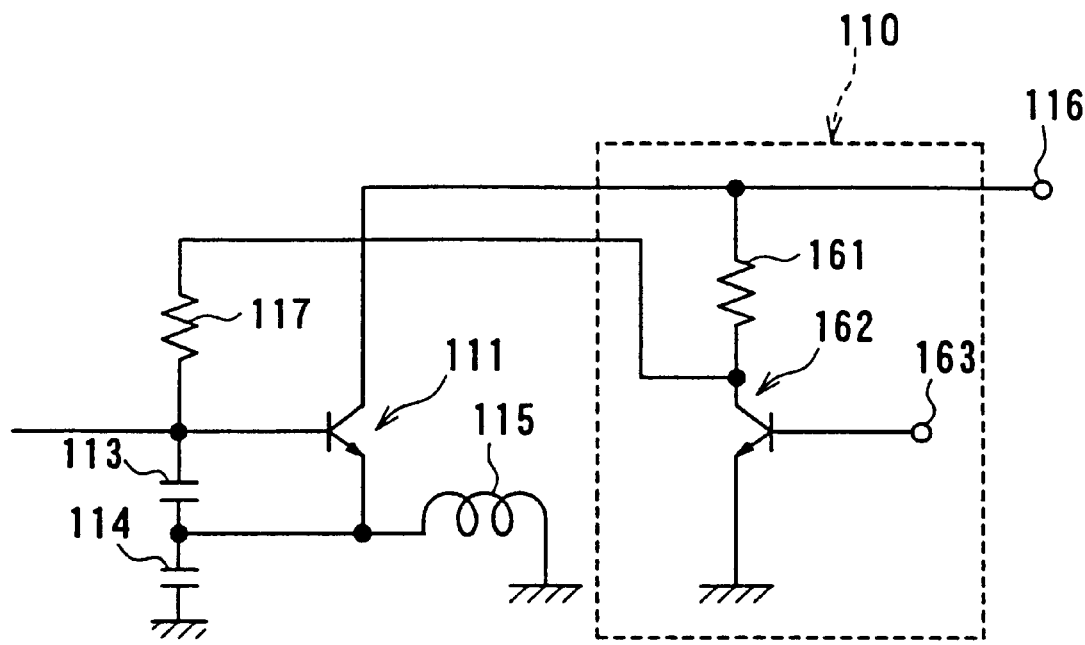
FIG. 22 is a circuit diagram illustrating a third example of the configuration of the excitation current control circuit of FIG. 16.

The third example shown in FIG. 22 is an example of the method of controlling the base bias voltage of the oscillation circuit and controlling the base bias current of the oscillation circuit. The excitation current control circuit 110 of the third example includes an NPN transistor 162. The collector of the transistor 162 is connected to the power input 116 and to the collector of the transistor 111 of the oscillation circuit through a load resistor 161. The connection point between the resistor 161 and the transistor 162 is connected to the base of the transistor 111 through the resistor 117. The emitter of the transistor 162 is grounded. The base of the transistor 162 is connected to a control signal input 163. The input 163 is connected to the control signal output 137 shown in FIG. 18 or FIG. 19.

In the control circuit 110 of the third example, the transistor 162 together with the load resistor 161 makes up an inverting amplification circuit. If the control signal is increased due to external perturbations, the collector potential of the transistor 162 is lowered and the base bias current of the transistor 111 is reduced. As a result, the excitation current is reduced and the control signal is reduced. On the contrary, if the control signal is reduced due to external perturbations, the excitation current is increased and the control signal is increased. In such a manner, the effect of external perturbations is eliminated as in the first example. In the third example, processing may be performed on the control signal as in the first example.

Figure 23:
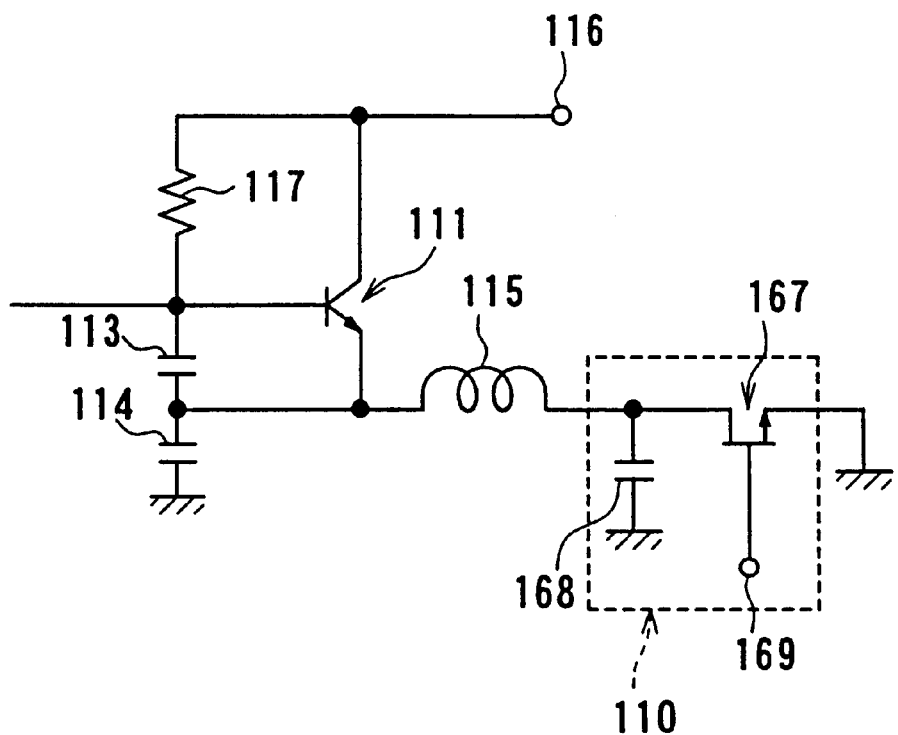
FIG. 23 is a circuit diagram illustrating a fourth example of the configuration of the excitation current control circuit of FIG. 16.

The fourth example shown in FIG. 23 is an example of the method of inserting a FET to the emitter circuit of the oscillation circuit and controlling the equivalent emitter resistor actively to control the base bias current of the oscillation circuit. The excitation current control circuit 110 of the fourth example includes a FET 167. The drain of the FET 167 is connected to the emitter of the transistor 111 of the oscillation circuit through the choke coil 115 for cutting off high frequency. The connection point between the drain of the FET 167 and the coil 115 is grounded in terms of alternating current through a large capacitance capacitor 168. The source of the FET 167 is grounded. The gate of the FET 167 is connected to a control signal input 169. The input 169 is connected to the control signal output 137 shown in FIG. 18 or FIG. 19.

In the control circuit 110 of the fourth example, the FET 167 functions as a variable resistor element, which is different from the third example. Since the FET 167 forms a drain follower and thus operates, the control signal inputted to the input 169 is required to be an inverse of the control signal outputted from the output 137. If the control signal outputted from the output 137 is increased due to external perturbations and the control signal inputted to the input 169 is reduced, the resistance between the drain and source of the FET 167 is increased and the impedance of the base input of the transistor 111 is increased. As a result, the base bias current of the transistor 111 is reduced, the excitation current is reduced and the control signal inputted to the input 169 is increased.

In such a manner, the control circuit 110 of the fourth example controls the base bias current of the transistor 111. If the drain-source resistance of the FET 167 increases, the emitter potential of the transistor 111 inevitably increases by the product of the emitter current of the transistor 111 and the amount of increase in drain-source resistance of the FET 167. Accordingly, the control circuit 110 of the fourth example has a function of controlling the operation voltage of the transistor 111, too. Alternatively, the emitter current of the transistor 111 may be directly controlled through the use of a bipolar transistor in place of the FET 167.

If the control signal inputted to the input 169 is increased due to external perturbations, the excitation current is increased and the control signal inputted to the input 169 is reduced. In the fourth example, the effect of external perturbations is eliminated in such a manner as in the first example. In the fourth example, too, processing may be performed on the control signal as in the first example.

Figure 24:
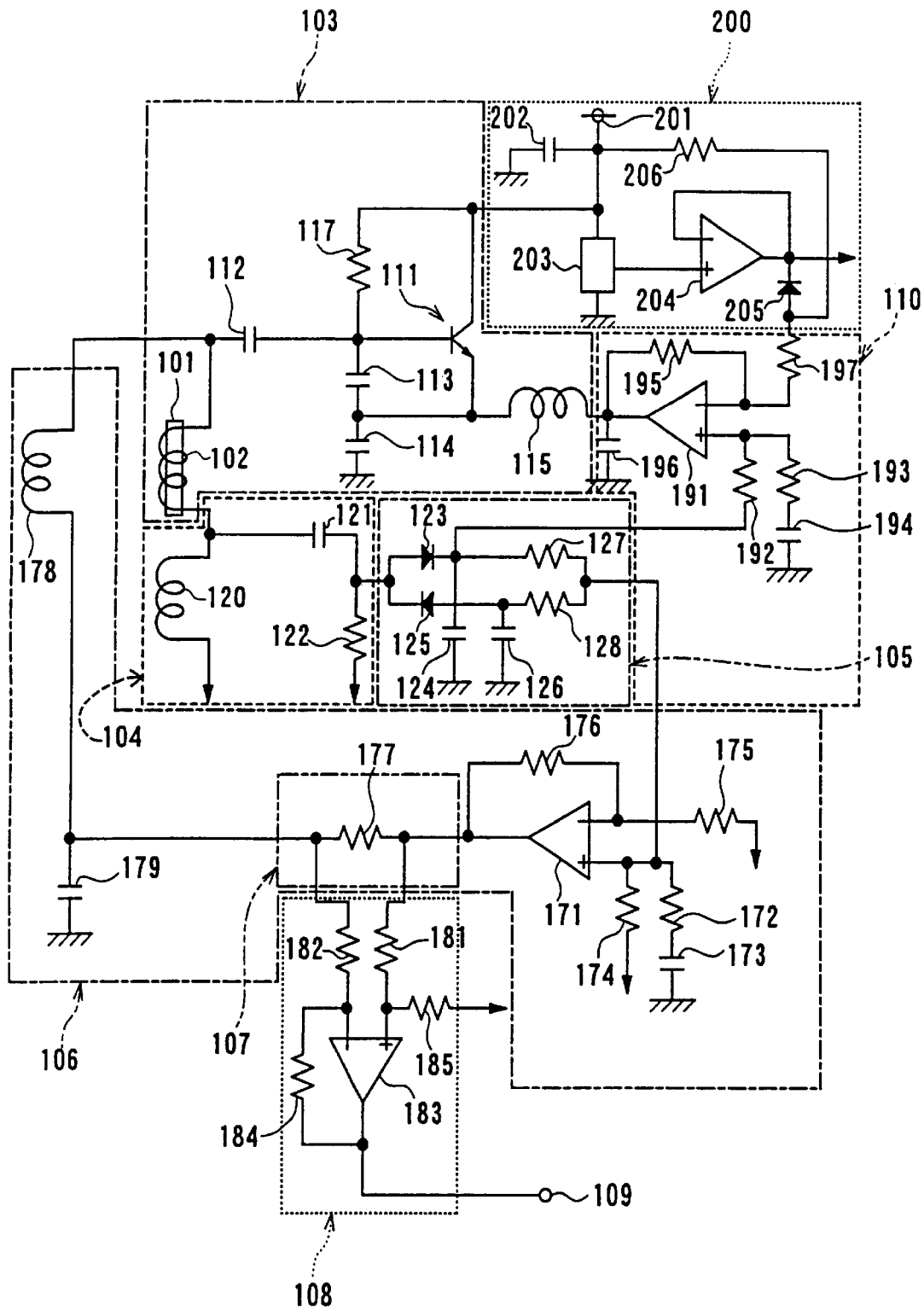
FIG. 24 is a circuit diagram illustrating an example of the entire configuration of the current sensor apparatus of the fifth embodiment.
Figure 25:
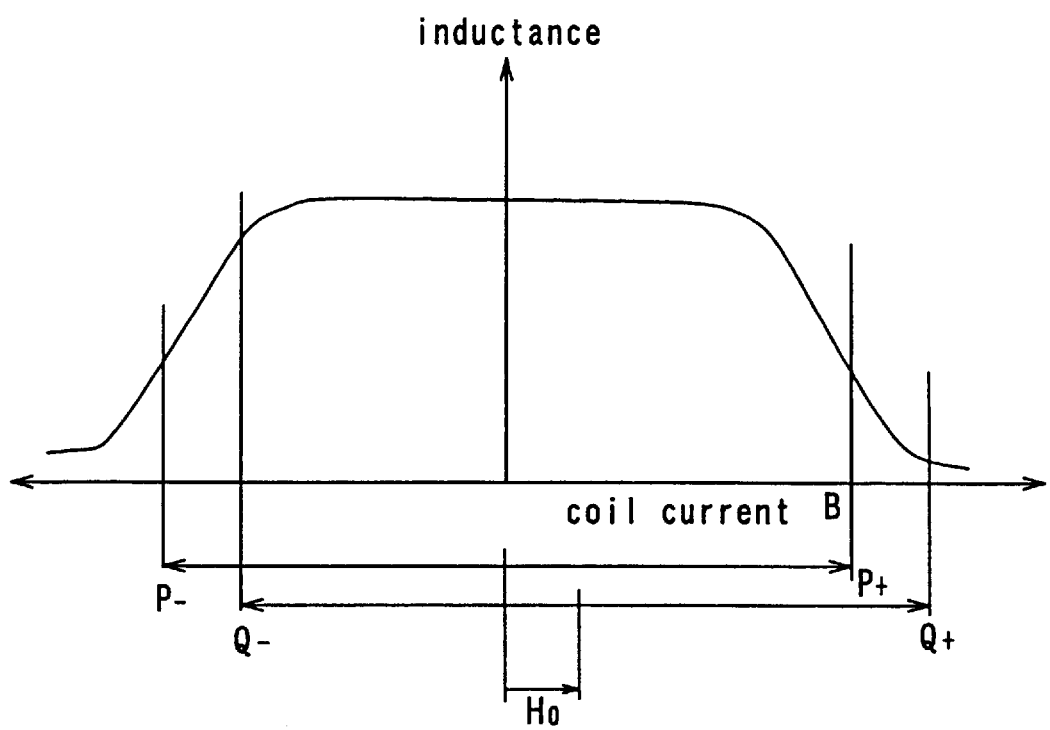
FIG. 25 is an explanatory view for describing the operation principle of a fluxgate element.

FIG. 24 is a circuit diagram illustrating an example of the entire configuration of the magnetic sensor apparatus and the current sensor apparatus of the embodiment. In this example, the configurations of the alternating current drive source 103, the excitation current detector 104 and the detection circuit 105 are similar to those of the example shown in FIG. 19 except that a specific voltage described later is applied to each end of the detection coil 120 and the resistor 122 that are grounded in the example shown in FIG. 19.

In the example shown in FIG. 24, the feedback circuit 106 has the following configuration. The feedback circuit 106 has an operational amplifier 171. A detection signal obtained from the resistor adding circuit made up of the resistors 127 and 128 is inputted to the noninverting input of the operational amplifier 171. The noninverting input of the operational amplifier 171 is grounded through the series circuit of a resistor 172 and a capacitor 173. Furthermore, a specific voltage described later is applied to the noninverting input of the operational amplifier 171 through a resistor 174. A specific voltage described later is applied to the inverting input of the operational amplifier 171 through a resistor 175. The inverting input of the operational amplifier 171 is connected to the output of the amplifier 171 through a resistor 176.

The feedback circuit 106 has a coil 178 used as a feedback current path an end of which is connected to an end of the sensor coil 102. The coil 178 is provided for supplying a negative feedback current to the coil 102. The other end of the coil 178 is grounded through a capacitor 179. The output of the operational amplifier 171 is connected to the other end of the coil 178 through a resistor 177 for detecting output. The resistor 177 makes up the feedback current detector 107 and forms part of the feedback circuit 106.

In the feedback circuit 106 shown in FIG. 24, although a detection signal is inputted to the noninverting input of the operational amplifier 171, whether a detection signal is inputted to the noninverting input or the inverting input of the amplifier 171 depends on the relationship among the direction of excitation current passing through the coil 102, the direction of the negative feedback current, and the direction of the magnetic field to be measured. That is, the magnetic field generated from the coil 102 by the negative feedback current is required to be directed opposite to the field to be measured. As a result, whether a detection signal is inputted to the noninverting input or the inverting input of the amplifier 171 depends on the winding direction of the turns of the coil 102.

In the example shown in FIG. 24, the output circuit 108 has the following configuration. The output circuit 108 has an operational amplifier 183. The noninverting input of the operational amplifier 183 is connected to the connection point between the resistor 177 and the output of the operational amplifier 171 through a resistor 181. The inverting input of the amplifier 183 is connected to the connection point between the resistor 177 and a capacitor 179 through a resistor 182. The output of the amplifier 183 is connected to the inverting input through a resistor 184. A specific voltage described later is applied to the noninverting input of the amplifier 183 through a resistor 185. The output of the amplifier 183 is connected to the output 109 through which a detection signal is outputted.

In the example shown in FIG. 24, the excitation current control circuit 110 has the following configuration. Although the control circuit 110 of this example controls the operation voltage of the oscillation circuit as in the example shown in FIG. 21, an operational amplifier is used in place of the transistor 157 of FIG. 21. The control circuit 110 of this example has an operational amplifier 191. The noninverting input of the operational amplifier 191 is connected to the connection point between the diode 123 and the capacitor 124 of the detection circuit 105 through a resistor 192. That is, a control signal is inputted to the noninverting input of the amplifier 191. The noninverting input of the amplifier 191 is grounded through a series circuit of a resistor 193 and a capacitor 194. The output of the amplifier 191 is connected to the inverting input through a resistor 195. The output of the amplifier 191 is connected to the coil 115 and grounded through a capacitor 196. The inverting input of the amplifier 191 is connected to a power supply circuit 200 described later through a resistor 197.

The current sensor apparatus shown in FIG. 24 comprises the power supply circuit 200 not shown in FIG. 16. The circuit 200 is provided for supplying power voltage to the alternating current drive source 103 and generating the specific voltage mentioned above. The circuit 200 has a standard voltage generator 203 an end of which is connected to a voltage source 201 generating supply voltage. The voltage generator 203 generates the specific voltage mentioned above. The connection point between the voltage source 201 and the voltage generator 203 is connected to the drive source 103 and to the collector of the transistor 111, and grounded through a capacitor 202. The other end of the voltage generator 203 is grounded.

The power supply circuit 200 has an operational amplifier 204. A voltage generated by the voltage generator 203 is applied to the noninverting input of the amplifier 204. The output of the amplifier 204 is connected to the inverting input. That is, the amplifier 204 makes up a voltage follower. The specific voltage outputted from the output of the amplifier 204 is supplied to the detection coil 120 and the resistors 122, 174, 175 and 185.

The cathode of a diode 205 is connected to the output of the amplifier 204. The anode of the diode 205 is connected to the inverting input of the amplifier 191 through the resistor 197 of the excitation current control circuit 110. The anode of the diode 205 is connected to the voltage source 201 through a resistor 206. The voltage applied to the inverting input of the amplifier 191 is higher than the voltage at the output of the amplifier 204 by the operation voltage of the diode 205.

The operation of the current sensor apparatus shown in FIG. 24 win now be described. The descriptions of the alternating current drive source 103, the excitation current detector 104 and the detection circuit 105 are omitted since they are described above.

The operation of the feedback circuit 106, the feedback current detector 107 and the output circuit 108 will now be described. A detection signal obtained at the resistor adding circuit of the resistors 127 and 128 is amplified at the amplifier made up of the operational amplifier 171 and so on, carried through the resistor 177, and applied to the connection point between the coil 178 and the capacitor 179. A negative feedback current is thereby supplied to the coil 102 through the coil 178, and magnetomotive force in the direction opposite to the magnetic field to be measured is applied to the coil 102.

The magnetic field is measured in the following manner. The current corresponding to the negative feedback current, that is, the field to be measured, is converted to a voltage at the resistor 177. This voltage is amplified by the differential amplifier made up of the operational amplifier 183 and so on. A measurement signal corresponding to the field to be measured is then generated and outputted from the output 109.

In the excitation current control circuit 110 shown in FIG. 24, the control signal is amplified by the amplifier made up of the operational amplifier 191 and so on, and carried through the choke coil 115 and applied to the emitter of the transistor 111 of the oscillation circuit. The operation of the control circuit 110 is similar to that of the control circuit 110 shown in FIG. 21.

According to the magnetic sensor apparatus and the current sensor apparatus of the embodiment thus described, the amounts of inductance variations of the coil 102 in the saturation region of the core 101, that is, the amounts of inductance variations of the coil 102 at positive and negative peaks of excitation current, are detected from the excitation current. Control of the excitation current is performed, based on the amounts of inductance variations. As a result, offset error variations due to external perturbations causing variations in inductance of the coil 102 are prevented.

According to the embodiment, in particular, the excitation current is controlled such that the amounts of inductance variations of the coil 102 at positive and negative peaks of excitation current are kept constant. As a result, the magnitude of the offset error resulting from the asymmetry between the positive and negative peaks of excitation current is kept constant, regardless of external perturbations. Therefore, according to the embodiment, it is possible to prevent offset error variations due to external perturbations. In addition, according to the embodiment, although the offset error is present, the magnitude thereof will not change. Therefore, the magnitude thereof is of a known value. Accordingly, the magnetic field or electric current to be measured is measured with precision by subtracting the known offset error from the measurement signal. In such a manner, the fluxgate magnetic sensor apparatus and the fluxgate current sensor apparatus make the most of the feature of the large amplitude excitation method and the negative feedback method, that is, 'excellent stability against external perturbations', according to the embodiment.

As thus described, according to the fluxgate magnetic sensor apparatus and the fluxgate current sensor apparatus of the embodiment, stabilization is collectively achieved with the simple circuitry against external perturbations such as temperature variations and supply voltage variations, without providing measures for individual components and circuits. This embodiment is therefore very effective for a sensor apparatus, such as a sensor apparatus aboard an automobile, used in an environment where great external perturbations exist.

Specific examples of properties of the current sensor apparatus actually fabricated through the use of the circuit configuration shown in FIG. 24 will now be described. In this apparatus, an offset error variation is 20 mV or less when the ambient temperature changes in the range from −40 to 105° C. when the measurement current falls within the range from 0 to ±100 A. An offset error variation is 20 mV or less, too, when the supply voltage changes in the range from 7 to 15 V. Thus, the apparatus is extremely stable against external perturbations. Variations in current detecting sensitivity under the same condition are 0.5% or less of the full scale.

According to the embodiment, a resonant current of the resonant circuit is supplied to the coil 102. As a result, an alternating excitation current that drives the core 101 into the saturation region is easily supplied to the coil 102.

According to the embodiment, a negative feedback current used for the negative feedback method is supplied to the coil 102 through the coil 178 connected to the coil 102 in parallel in terms of alternating current. As a result, the feedback current is easily supplied to the coil 102 without losing the resonant current.

According to the embodiment, the detection coil 120 is inserted to the resonant circuit. As a result, a detection output of the order of volts is easily obtained, without reducing value Q of the resonant circuit, that is, without causing insufficiency in resonant current supplied to the coil 102. In addition, the peak hold circuit is implemented by a simple and inexpensive one using a diode and a capacitor. A sufficiently large output is obtained through the detection coil 120 even if the inductance thereof is less than ten percent of the inductance of the coil 102. Therefore, since the number of turns of the detection coil 120 is small and the saturation current is usually sufficiently large, the coil 120 will not be saturated due to the drive current (resonant current) of the coil 102.

Through those techniques, the large amplitude method and the negative feedback method are applicable while a magnetic core, such as a ferrite core, having a large saturation field and large nonlinearity is used. It is thereby possible to use a fluxgate element for detecting a large magnetic field or a large electric current.

The features of the current sensor apparatus of the embodiment are listed below.

(1) The apparatus is stable against external perturbations such as temperature variations and supply voltage variations.

(2) Since the negative feedback method is applicable, sensitivity variations are reduced and thermal characteristics are improved automatically.

(3) Thus, no sensitivity adjustment or thermal characteristic compensation is required.

(4) No offset adjustment is required.

(5) The apparatus exhibits excellent properties since the large amplitude excitation method is applicable.

(6) No special method is required for fabricating the sensor section.

(7) Since resonant current is utilized, the sensor coil is driven at a low supply voltage and a high frequency.

(8) No special material or method is required for fabricating the apparatus and the circuit is very simple. As a result, the apparatus is manufactured at an extremely low cost and it is possible to meet the great demand.

(9) The apparatus has an excellent frequency response.

(10) Power consumption is low since resonant current is used.

(11) The apparatus is small and light-weight since the configuration is simple.

The circuit configurations described in the foregoing embodiment are given as examples and may be practiced in still other ways through the use of known techniques.

According to the magnetic sensor apparatus or the current sensor apparatus of the invention including the fifth embodiment, an alternating drive current that drives the core into the saturation region is supplied to the sensor coil, and variations in the inductance of the sensor coil are detected. The magnetic field to be measured is thereby detected. In addition, the amounts of inductance variations in the saturation region of the core are detected in an equivalent manner by the inductance variation amount detection means. The drive current is controlled by the control means, based on the amounts of inductance variations. As a result, it is possible to prevent measurement error variations due to external perturbations and to implement a sensor apparatus stable against external perturbations.

The control means may control the drive current such that the amounts of inductance variations detected by the inductance variation amount detection means is kept constant. In this case, it is possible to maintain the measurement error changing in response to the amounts of inductance variations at a specific value, in particular. It is thereby possible to implement a sensor apparatus more stable against external perturbations.

Although the Colpitts oscillation circuit and the Clapp oscillation circuit are used as examples of the oscillation circuit in the foregoing embodiments, the invention is not limited to those circuits but may be applied to cases where any other oscillation circuit such as a Hartley oscillation circuit is utilized.

Obviously many modifications and variations of the present invention are possible in the light of the above teachings. It is therefore to be understood that within the scope of the appended claims the invention may be practiced otherwise than as specifically described.

What is claimed is:

1. A magnetic sensor apparatus comprising:
   a magnetic core;
   a sensor coil wound around the core and provided for detecting an applied magnetic field to be measured;
   a drive means having a series resonant circuit part of which is made up of the sensor coil, the drive means driving the sensor coil by supplying a resonant current flowing through the series resonant circuit to the sensor coil; and
   an inductance element connected to the sensor coil in series, wherein the inductance element is used for detecting a variation in the resonant current flowing through the sensor coil.

2. A magnetic sensor apparatus comprising:
   a magnetic core;
   a sensor coil wound around the core and provided for detecting an applied magnetic field to be measured;

a drive means having a series resonant circuit part of which is made up of the sensor coil, the drive means driving the sensor coil by supplying a resonant current flowing through the series resonant circuit to the sensor coil; and an inductance element connected to the sensor coil in series, wherein the inductance element is used for supplying a second current to the sensor coil, the second current including:
   a direct current; and
   a current having a frequency different from a resonant frequency of the series resonant circuit.

3. A magnetic sensor apparatus comprising:
a magnetic core;
a sensor coil wound around the core and provided for detecting an applied magnetic field to be measured;
a drive means having a series resonant circuit part of which is made up of the sensor coil, the drive means driving the sensor coil by supplying a resonant current flowing through the series resonant circuit to the sensor coil; and
a detection means for detecting the magnetic field by detecting a variation in the resonant current flowing through the sensor coil.

4. The magnetic sensor apparatus according to claim 3 wherein the resonant current is a current having such a magnitude that the core is driven into a saturation region.

5. The magnetic sensor apparatus according to claim 3 wherein the detection means has:
   an inductance element inserted to the series resonant circuit; and
   a differentiation circuit for differentiating a voltage generated across the inductance element and outputting a signal obtained by differentiating the voltage, the signal corresponding to the magnetic field to be measured.

6. The magnetic sensor apparatus according to claim 3 wherein the drive means has an alternating current source for supplying an alternating current to the series resonant circuit, the alternating current being tuned with a resonant frequency of the series resonant circuit.

7. The magnetic sensor apparatus according to claim 3 wherein the drive means has an oscillation circuit including the series resonant circuit.

8. The magnetic sensor apparatus according to claim 7 wherein the oscillation circuit is a Clapp oscillation circuit or a Colpitts oscillation circuit.

9. The magnetic sensor apparatus according to claim 3 wherein the core is made of ferrite.

10. A magnetic sensor apparatus comprising:
a magnetic core;
a sensor coil wound around the core and provided for detecting an applied magnetic field to be measured;
a drive means for driving the sensor coil by supplying an alternating current thereto;
an inductance element connected to the sensor coil in series; and
differentiation circuit for differentiating a voltage generated across the inductance element and outputting a signal corresponding to the magnetic field.

11. The magnetic sensor apparatus according to claim 10 wherein the alternating current is a current having such a magnitude that the core is driven into a saturation region.

12. The magnetic sensor apparatus according to claim 10 wherein the core is made of ferrite.

13. A magnetic sensor apparatus comprising:
a magnetic core;
a sensor coil wound around the core and provided for detecting an applied magnetic field to be measured;
a drive means having a series resonant circuit part of which is made up of the sensor coil, the drive means driving the sensor coil by supplying a resonant current flowing through the series resonant circuit to the sensor coil; and
a current supply means for supplying a second current to the sensor coil, the second current including:
   a direct current; and
   a current having a frequency different from a resonant frequency of the series resonant circuit.

14. The magnetic sensor apparatus according to claim 13 wherein the resonant current is a current having such a magnitude that the core is driven into a saturation region.

15. The magnetic sensor apparatus according to claim 13 wherein the drive means has an oscillation circuit including the series resonant circuit.

16. The magnetic sensor apparatus according to claim 13 wherein the current supply means has a second coil that forms part of the series resonant circuit and is connected to the sensor coil in parallel when seen from the series resonant circuit, and the current supply means supplies the second current to the sensor coil through the second coil.

17. The magnetic sensor apparatus according to claim 16 wherein the second coil has an inductance equal to or greater than an inductance of the sensor coil.

18. The magnetic sensor apparatus according to claim 16 wherein the current supply means further has a capacitor connected to the second coil in parallel, and a parallel resonant frequency of the capacitor and the second coil is set to a frequency nearly equal to the resonant frequency of the series resonant circuit.

19. The magnetic sensor apparatus according to claim 13, further comprising a detection means for detecting the magnetic field, based on the resonant current flowing through the sensor coil.

20. The magnetic sensor apparatus according to claim 19 wherein the detection means detects the magnetic field, based on part of the resonant current flowing through the sensor coil that drives the core into a saturation region.

21. The magnetic sensor apparatus according to claim 19 wherein the detection means detects the magnetic field, based on components having asymmetric positive and negative portions of the resonant current flowing through the sensor coil.

22. The magnetic sensor apparatus according to claim 19 wherein the detection means has: an inductance element inserted to the series resonant circuit; and a differentiation circuit for differentiating a voltage generated across the inductance element and outputting a signal corresponding to the magnetic field to be measured.

23. The magnetic sensor apparatus according to claim 13 wherein the current supply means supplies the second current to the sensor coil such that the resonant current flowing through the sensor coil has positive and negative portions constantly symmetric.

24. A magnetic sensor apparatus comprising:
a magnetic core;
a sensor coil wound around the core and provided for detecting an applied magnetic field to be measured;
a drive means for driving the sensor coil by supplying an alternating drive current that drives the core into a saturation region to the sensor coil;

a field detection means for detecting the magnetic field by detecting a variation in inductance of the sensor coil;

an inductance variation amount detection means for detecting an amount of an inductance variation in the saturation region of the core in an equivalent manner; and a control means for controlling the drive current, based on the amount of the inductance variation detected by the inductance variation amount detection means.

25. The magnetic sensor apparatus according to claim 24 wherein the control means controls the drive current such that the amount of the inductance variation detected by the inductance variation detection means is kept constant.

26. The magnetic sensor apparatus according to claim 24 wherein the control means controls an operation voltage of the drive means in an equivalent manner.

27. The magnetic sensor apparatus according to claim 24 wherein the control means controls an operation point of the drive means in an equivalent manner.

28. The magnetic sensor apparatus according to claim 24 wherein the inductance variation amount detection means detects the amount of the inductance variation, based on the drive current in the saturation region of the core.

29. The magnetic sensor apparatus according to claim 28 wherein the inductance variation amount detection means has: an inductance element connected to the sensor coil in series; and a differentiation circuit for differentiating a voltage generated across the inductance element and outputting a signal corresponding to the amount of the inductance variation.

30. The magnetic sensor apparatus according to claim 24 wherein the field detection means has: an inductance element connected to the sensor coil in series; and a differentiation circuit for differentiating a voltage generated across the inductance element and outputting a signal corresponding to the magnetic field to be measured.

31. The magnetic sensor apparatus according to claim 24 wherein the drive means has a self-excited oscillation circuit having a circuit for determining an oscillation time constant part of which is made up of the sensor coil.

32. The magnetic sensor apparatus according to claim 31 wherein the self-excited oscillation circuit is a Clapp oscillation circuit or a Colpitts oscillation circuit.

33. The magnetic sensor apparatus according to claim 24, further comprising a negative feedback current supply means for supplying a negative feedback current to the sensor coil, the negative feedback current being used for negative feedback of an output of the field detection means.

34. A current sensor apparatus for measuring an electric current by measuring a magnetic field generated by the current to be measured, the apparatus comprising:

a magnetic core;

a sensor coil wound around the core and provided for detecting an applied magnetic field to be measured;

a drive means having a series resonant circuit part of which is made up of the sensor coil, the drive means driving the sensor coil by supplying a resonant current flowing through the series resonant circuit to the sensor coil; and an inductance element connected to the sensor coil in series.

35. A current sensor apparatus for measuring an electric current by measuring a magnetic field generated by the current to be measured, the apparatus comprising:

a magnetic core;

a sensor coil wound around the core and provided for detecting an applied magnetic field to be measured;

a drive means having a series resonant circuit part of which is made up of the sensor coil, the drive means driving the sensor coil by supplying a resonant current flowing through the series resonant circuit to the sensor coil; and an inductance element connected to the sensor coil in series, wherein the inductance element is used for detecting a variation in the resonant current flowing through the sensor coil.

36. A current sensor apparatus for measuring an electric current by measuring a magnetic field generated by the current to be measured, the apparatus comprising:

a magnetic core;

a sensor coil wound around the core and provided for detecting an applied magnetic field to be measured;

a drive means having a series resonant circuit part of which is made up of the sensor coil, the drive means driving the sensor coil by supplying a resonant current flowing through the series resonant circuit to the sensor coil; and an inductance element connected to the sensor coil in series, wherein the inductance element is used for supplying a second current to the sensor coil, the second current including:

a direct current; and a current having a frequency different from a resonant frequency of the series resonant circuit.

37. A current sensor apparatus for measuring an electric current by measuring a magnetic field generated by the current to be measured, the apparatus comprising:

a magnetic core;

a sensor coil wound around the core and provided for detecting an applied magnetic field to be measured;

a drive means having a series resonant circuit part of which is made up of the sensor coil, the drive means driving the sensor coil by supplying a resonant current flowing through the series resonant circuit to the sensor coil; and a detection means for detecting the magnetic field by detecting a variation in the resonant current flowing through the sensor coil.

38. The current sensor apparatus according to claim 37 wherein the resonant current is a current having such a magnitude that the core is driven into a saturation region.

39. The current sensor apparatus according to claim 37 wherein the detection means has: an inductance element inserted to the series resonant circuit; and a differentiation circuit for differentiating a voltage generated across the inductance element and outputting a signal obtained by differentiating the voltage, the signal corresponding to the magnetic field to be measured.

40. The current sensor apparatus according to claim 37 wherein the drive means has an alternating current source for supplying an alternating current to the series resonant circuit, the alternating current being tuned with a resonant frequency of the series resonant circuit.

41. The current sensor apparatus according to claim 37 wherein the drive means has an oscillation circuit including the series resonant circuit.

42. The current sensor apparatus according to claim 41 wherein the oscillation circuit is a Clapp oscillation circuit or a Colpitts oscillation circuit.

43. The current sensor apparatus according to claim 37 wherein the core is made of ferrite.

44. A current sensor apparatus for measuring an electric current by measuring a magnetic field generated by the current to be measured, the apparatus comprising:

a magnetic core;

a sensor coil wound around the core and provided for detecting an applied magnetic field to be measured;

a drive means for driving the sensor coil by supplying an alternating current thereto;

an inductance element connected to the sensor coil in series; and a differentiation circuit for differentiating a voltage generated across the inductance element and outputting a signal corresponding to the magnetic field.

45. The current sensor apparatus according to claim 44 wherein the alternating current is a current having such a magnitude that the core is driven into a saturation region.

46. The current sensor apparatus according to claim 44 wherein the core is made of ferrite.

47. A current sensor apparatus for measuring an electric current by measuring a magnetic field generated by the current to be measured, the apparatus comprising:

a magnetic core;

a sensor coil wound around the core and provided for detecting an applied magnetic field to be measured;

a drive means having a series resonant circuit part of which is made up of the sensor coil, the drive means driving the sensor coil by supplying a resonant current flowing through the series resonant circuit to the sensor coil; and a current supply means for supplying a second current to the sensor coil, the second current including:

a direct current; and a current having a frequency different from a resonant frequency of the series resonant circuit.

48. The current sensor apparatus according to claim 47 wherein the resonant current is a current having such a magnitude that the core is driven into a saturation region.

49. The current sensor apparatus according to claim 47 wherein the drive means has an oscillation circuit including the series resonant circuit.

50. The current sensor apparatus according to claim 47 wherein the current supply means has a second coil that forms part of the series resonant circuit and is connected to the sensor coil in parallel when seen from the series resonant circuit, and the current supply means supplies the second current to the sensor coil through the second coil.

51. The current sensor apparatus according to claim 50 wherein the second coil has an inductance equal to or greater than an inductance of the sensor coil.

52. The current sensor apparatus according to claim 50 wherein the current supply means further has a capacitor connected to the second coil in parallel, and a parallel resonant frequency of the capacitor and the second coil is set to a frequency nearly equal to the resonant frequency of the series resonant circuit.

53. The current sensor apparatus according to claim 47, further comprising a detection means for detecting the magnetic field, based on the resonant current flowing through the sensor coil.

54. The current sensor apparatus according to claim 53 wherein the detection means detects the magnetic field, based on part of the resonant current flowing through the sensor coil that drives the core into a saturation region.

55. The current sensor apparatus according to claim 53 wherein the detection means detects the magnetic field, based on components having asymmetric positive and negative portions of the resonant current flowing through the sensor coil.

56. The current sensor apparatus according to claim 53 wherein the detection means has: an inductance element inserted to the series resonant circuit; and a differentiation circuit for differentiating a voltage generated across the inductance element and outputting a signal corresponding to the magnetic field to be measured.

57. The current sensor apparatus according to claim 47 wherein the current supply means supplies the second current to the sensor coil such that the resonant current flowing through the sensor coil has positive and negative portions constantly symmetric.

58. A current sensor apparatus for measuring an electric current by measuring a magnetic field generated by the current to be measured, the apparatus comprising:

a magnetic core;

a sensor coil wound around the core and provided for detecting an applied magnetic field to be measured;

a drive means for driving the sensor coil by supplying an alternating drive current that drives the core into a saturation region to the sensor coil;

a field detection means for detecting the magnetic field by detecting a variation in inductance of the sensor coil;

an inductance variation amount detection means for detecting an amount of an inductance variation in the saturation region of the core in an equivalent manner; and a control means for controlling the drive current, based on the amount of the inductance variation detected by the inductance variation amount detection means.

59. The current sensor apparatus according to claim 58 wherein the control means controls the drive current such that the amount of the inductance variation detected by the inductance variation amount detection means is kept constant.

60. The current sensor apparatus according to claim 58 wherein the control means controls an operation voltage of the drive means in an equivalent manner.

61. The current sensor apparatus according to claim 58 wherein the control means controls an operation point of the drive means in an equivalent manner.

62. The current sensor apparatus according to claim 58 wherein the inductance variation amount detection means detects the amount of the inductance variation, based on the drive current in the saturation region of the core.

63. The current sensor apparatus according to claim 62 wherein the inductance variation amount detection means has: an inductance element connected to the sensor coil in series; and a differentiation circuit for differentiating a voltage generated across the inductance element and outputting a signal corresponding to the amount of the inductance variation.

64. The current sensor apparatus according to claim 58 wherein the field detection means has: an inductance element connected to the sensor coil in series; and a differentiation circuit for differentiating a voltage generated across the inductance element and outputting a signal corresponding to the magnetic field to be measured.

65. The current sensor apparatus according to claim 58 wherein the drive means has a self-excited oscillation circuit having a circuit for determining an oscillation time constant part of which is made up of the sensor coil.

66. The current sensor apparatus according to claim 58 wherein the self-excited oscillation circuit is a Clapp oscillation circuit or a Colpitts oscillation circuit.

67. The current sensor apparatus according to claim 58, further comprising a negative feedback current supply means for supplying a negative feedback current to the sensor coil, the negative feedback current being used for negative feedback of an output of the field detection means.

* * * * *

UNITED STATES PATENT AND TRADEMARK OFFICE
CERTIFICATE OF CORRECTION

PATENT NO. : 6,316,931 B1
DATED : November 13, 2001
INVENTOR(S) : Shiro Nakagawa, Kazuyuki Itoh, Yoshihisa Okita and Katsumi Yabusaki It is certified that error appears in the above-identified patent and that said Letters Patent is hereby corrected as shown below:

Column 5,
Line 46, delete "variation" and substitute therefore -- variations --;

Column 30,
Line 32, delete "Ld di/dt" and substitute therefore -- Ld • di/dt --;

Column 36,
Line 5, delete "win" and substitute therefore -- will --;

Column 39,
Line 60, before "differentiation" insert therefore -- a --; and

Column 41,
Line 13 "variation" and "detection", insert -- amount --;
Lines 48-61, "claim 34" should be deleted and the subsequent claims should be renumbered.

Signed and Sealed this

Thirteenth Day of August, 2002

Attest:

JAMES E. ROGAN
*Attesting Officer*  *Director of the United States Patent and Trademark Office*